US012635189B2

(12) United States Patent
Chen et al.

(10) Patent No.: US 12,635,189 B2
(45) Date of Patent: May 19, 2026

(54) SEMICONDUCTOR DEVICE AND METHOD OF MANUFACTURING THEREOF

(71) Applicant: TAIWAN SEMICONDUCTOR MANUFACTURING COMPANY, LTD., Hsinchu (TW)

(72) Inventors: Wen-Yen Chen, Hsinchu (TW); Tsai-Yu Huang, Taoyuan (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 987 days.

(21) Appl. No.: 17/849,424

(22) Filed: Jun. 24, 2022

(65) Prior Publication Data

US 2023/0420563 A1      Dec. 28, 2023

(51) Int. Cl.
| | |
|---|---|
| *H10D 30/69* | (2025.01) |
| *H10D 30/60* | (2025.01) |
| *H10D 30/67* | (2025.01) |
| *H10D 64/23* | (2025.01) |

(52) U.S. Cl.
CPC ......... *H10D 30/797* (2025.01); *H10D 30/601* (2025.01); *H10D 64/251* (2025.01); *H10D 30/6757* (2025.01)

(58) Field of Classification Search
CPC .. H10D 30/797; H10D 30/601; H10D 64/251; H10D 30/6757; H10D 30/0198; H10D 30/024; H10D 30/014; H10D 30/43; H10D 64/017; H10D 30/6735; H10D 30/6758; H10D 64/256; H10D 64/254; H10D 62/822; H10D 62/121; H10D 62/151; B82Y 10/00; H01L 21/268
See application file for complete search history.

(56) References Cited

U.S. PATENT DOCUMENTS

| | | | |
|---|---|---|---|
| 8,283,702 B2 * | 10/2012 | Salinas | ................ H01L 21/268 257/E23.114 |
| 9,391,078 B1 * | 7/2016 | Liu | ..................... H10D 62/822 |
| 10,276,719 B1 | 4/2019 | Duriez et al. | |
| 12,342,587 B2 * | 6/2025 | Lin | ................... H10D 84/8311 |
| 2010/0047996 A1 | 2/2010 | Yuan et al. | |

(Continued)

*Primary Examiner* — Douglas W Owens
(74) *Attorney, Agent, or Firm* — STUDEBAKER BRACKETT PLLC

(57) ABSTRACT

A semiconductor device includes a field effect transistor disposed over a first main surface of a semiconductor substrate, a distributed Bragg reflector disposed over an opposing second main surface of the semiconductor substrate, and a conductive via disposed in the distributed Bragg reflector. The field effect transistor includes a gate structure and a source/drain region. The conductive via passes through the semiconductor substrate and is in direct electrical contact with the source/drain region. A metal silicide is formed in a portion of the source/drain region that is in contact with the conductive via, and thus can reduce contact resistance between the source/drain region and the conductive via. The source/drain region is laser annealed through an opening formed through the distributed Bragg reflector. The distributed Bragg reflector reduces or prevents thermal damage to other regions of the semiconductor device that are protected by the distributed Bragg reflector.

20 Claims, 21 Drawing Sheets

(56) References Cited

U.S. PATENT DOCUMENTS

| | | | | |
|---|---|---|---|---|
| 2016/0211261 | A1 | 7/2016 | Liu et al. | |
| 2019/0006553 | A1 | 1/2019 | Jain et al. | |
| 2020/0168742 | A1* | 5/2020 | Wang | H01L 21/02532 |
| 2022/0344465 | A1* | 10/2022 | Chen | H10D 84/834 |
| 2023/0026310 | A1* | 1/2023 | Chang | H10D 30/6713 |
| 2023/0282698 | A1* | 9/2023 | More | H10D 30/6735 |
| | | | | 257/288 |
| 2023/0352594 | A1* | 11/2023 | Lu | H10D 62/151 |
| 2024/0379355 | A1* | 11/2024 | Chen | H10D 62/121 |
| 2025/0081572 | A1* | 3/2025 | Lin | H10D 30/014 |

* cited by examiner

2700

S2710  Form semiconductor component including epitaxial region

S2720  Form alternating first and second layers having different refractive indexes S2730  Form opening in alternating first and second layers S2740  Implant dopant into epitaxial region through opening S2750  Irradiate doped epitaxial layer with laser radiation

SEMICONDUCTOR DEVICE AND METHOD OF MANUFACTURING THEREOF

BACKGROUND

As the semiconductor industry has progressed into nanometer technology process nodes in pursuit of higher device density, greater performance, and lower costs, challenges for both design and fabrication of integrated circuits have greatly increased. For example, during manufacturing a semiconductor device, processing a structure or region of the semiconductor device may affect or even damage other structures or regions of the semiconductor device due to the high density, and thus may reduce quality and productivity of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the following embodiments, the term "upper" "over" and/or "above" are defined along directions with an increase in a distance from the front surface and the back surface. Materials, configurations, dimensions, processes and/or operations as explained with respect to one embodiment may be employed in the other embodiments, and the detailed description thereon may be omitted.

FIGS. 1-24 show views of various stages for manufacturing semiconductor devices according to embodiments of the present disclosure. It is understood that additional operations can be provided before, during, and after processes shown by FIGS. 1-24, and some of the operations described below can be replaced or eliminated, for additional embodiments of the method. The order of the operations/processes may be interchangeable.

In FIGS. 1A-4B, the "A" figures (FIG. 1A, 2A, . . . ) show cross sectional views along the Y direction, and the "B" figures (FIGS. 1B, 2B, . . . ) show plan views (top views).

Figures 1A, 1B:
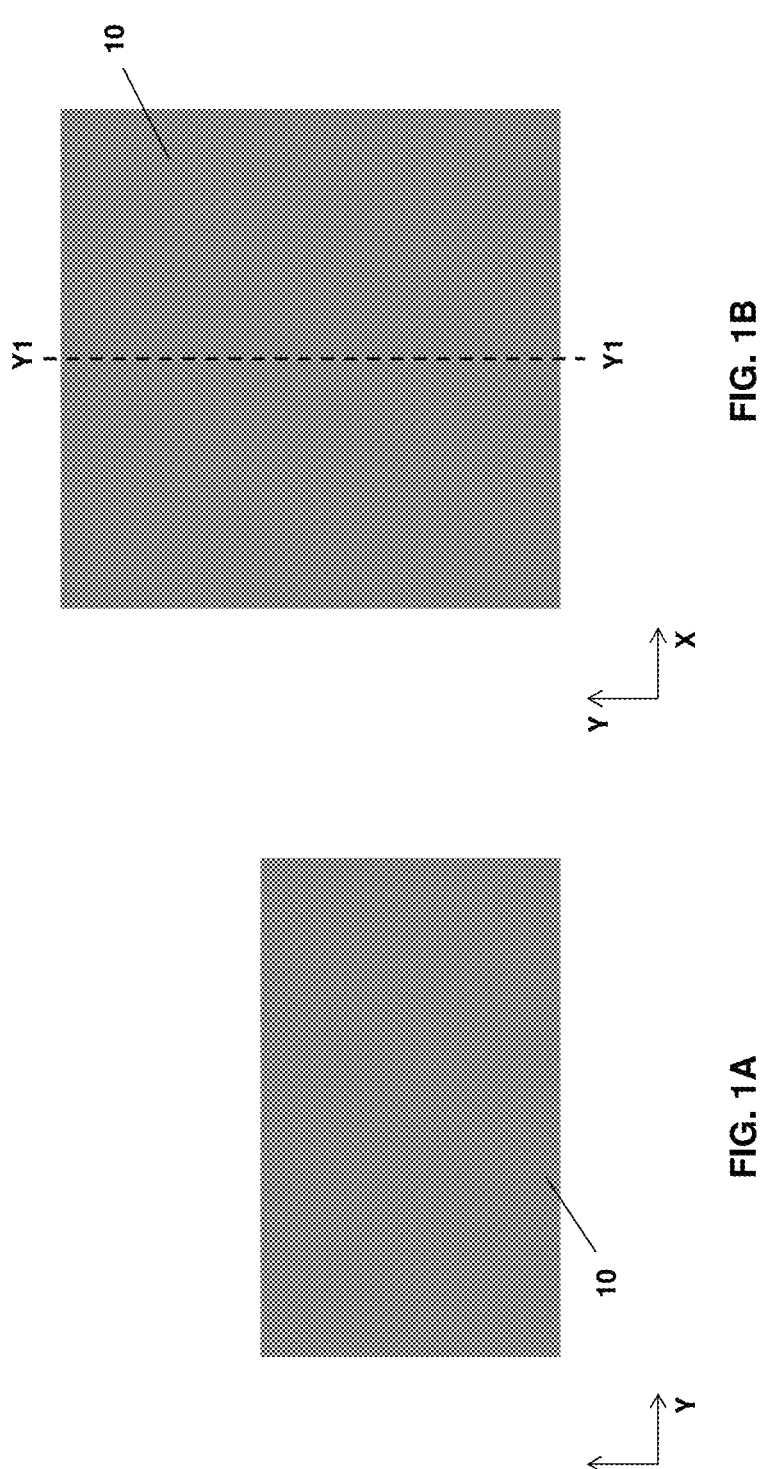
FIGS. 1A and 1B show one of various stages for manufacturing a semiconductor device according to embodiments of the present disclosure.

FIGS. 1A and 1B show one of the various stages of sequential processes for manufacturing a semiconductor device having FinFETs according to an embodiment of the present disclosure. FIG. 1A is a cross sectional view corresponding to line Y1-Y1 of FIG. 1B.

As shown in FIGS. 1A and 1B, a semiconductor substrate 10 is provided. In one embodiment, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In some embodiment, the substrate 10 is silicon wafer.

The substrate 10 may include in its surface region, one or more buffer layers (not shown). The buffer layers can serve to gradually change the lattice constant from that of the substrate to that of the source/drain regions. Source/drain region(s) may refer to a source or a drain, individually or collectively dependent upon the context. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. The substrate 10 may include various regions that have been suitably doped with impurities (e.g., p-type or n-type conductivity).

Figures 2A, 2B:
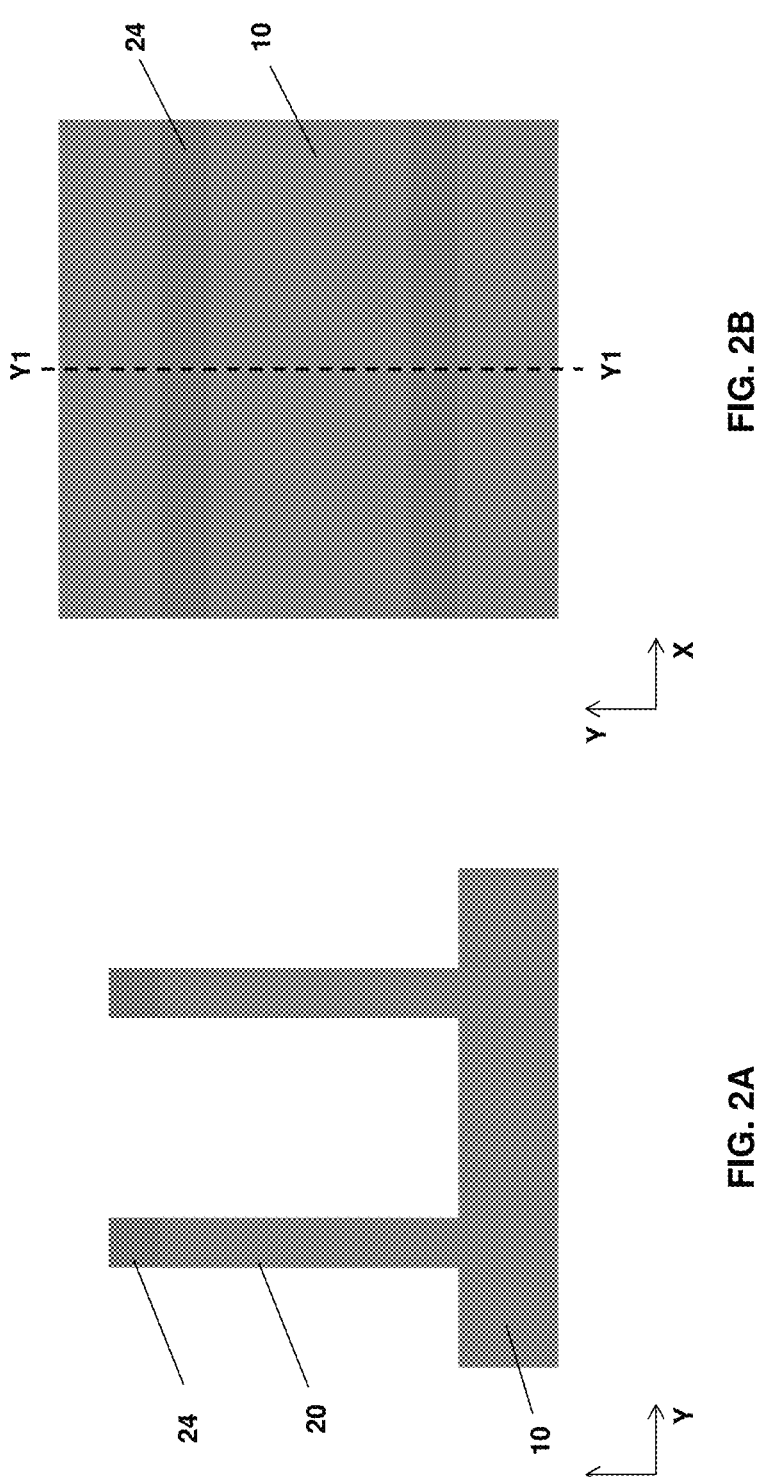
FIGS. 2A and 2B show one of various stages for manufacturing a semiconductor device according to embodiments of the present disclosure.

As shown in FIGS. 2A and 2B, fin structures 20 are formed over a substrate 10. The fin structures 20 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a dummy layer is formed over a substrate and patterned using a photolithography process. Spacers are formed alongside the patterned dummy layer using a self-aligned process. The dummy layer is then removed, and the remaining spacers may then be used to pattern the fins.

In other embodiments, the fin structures can be patterned by using a hard mask pattern 24 as an etching mask. In some embodiments, the hard mask pattern 24 includes a first mask layer and a second mask layer disposed on the first mask layer. The first mask layer is a pad oxide layer made of a silicon oxide, which can be formed by a thermal oxidation. The second mask layer is made of silicon nitride, which is formed by chemical vapor deposition (CVD), including low pressure CVD (LPCVD) and plasma enhanced CVD (PECVD), physical vapor deposition (PVD), atomic layer deposition (ALD), or other suitable process. The deposited hard mask layer is patterned into a hard mask pattern 24 by using patterning operations including photo-lithography and etching. Then, the substrate 10 is patterned by using the hard mask pattern into fin structures 20, both extending in the X direction. In FIGS. 2A and 2B, two fin structures 20 are arranged in the Y direction. But the number of the fin structures is not limited to two, and may be one or three or more. In some embodiments, one or more dummy fin structures are formed on both sides of the fin structures to improve pattern fidelity in the patterning operations.

The width of the upper portion of the fin structures 20 along the Y direction is in a range from about 5 nm to about 40 nm in some embodiments, and is in a range from about 10 nm to about 20 nm in other embodiments. The height along the Z direction of the fin structure is in a range from about 100 nm to about 200 nm in some embodiments.

Figure 3B:
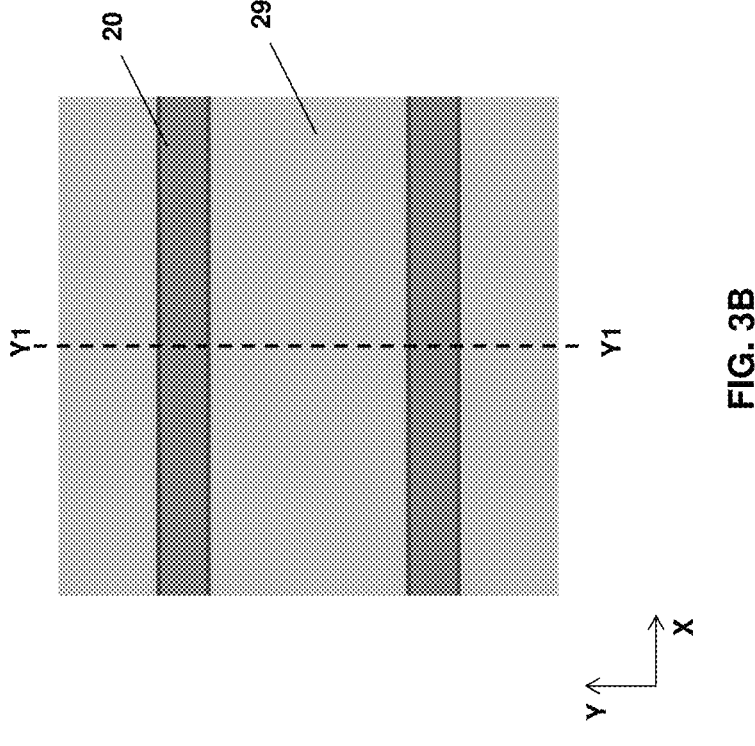
FIGS. 3A and 3B show one of various stages for manufacturing a semiconductor device according to embodiments of the present disclosure.
Figure 3A:
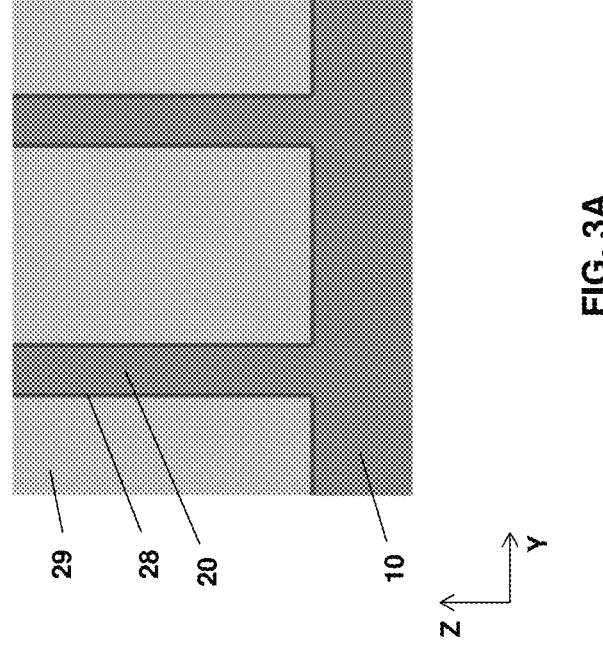

FIGS. 3A and 3B show one of the various stages of sequential processes for manufacturing a semiconductor device having FinFETs with a flat-top source/drain epitaxial layer according to an embodiment of the present disclosure. FIG. 3A is a cross sectional view corresponding to line Y1-Y1 of FIG. 3B.

After the fin structures 20 are formed, a first insulating material layer 29 including one or more layers of insulating material is formed over the substrate 10 so that the fin structures are fully embedded in the first insulating material layer 29. The insulating material for the first insulating material layer 29 may include silicon oxide, silicon nitride, silicon oxynitride (SiON), SiCN, fluorine-doped silicate glass (FSG), or a low-k dielectric material, formed by LPCVD (low pressure chemical vapor deposition), plasma-CVD or flowable CVD or any other suitable film formation methods. In some embodiments, the first insulating material layer 29 is made of silicon oxide. An annealing operation may be performed after the formation of the first insulating material layer 29. Then, a planarization operation, such as a chemical mechanical polishing (CMP) method and/or an etch-back method, is performed such that the hard mask patterns 24 are removed and upper surfaces of the fin structures 20 are exposed from the first insulating material layer 29 as shown in FIG. 3A.

Figures 4A, 4B:
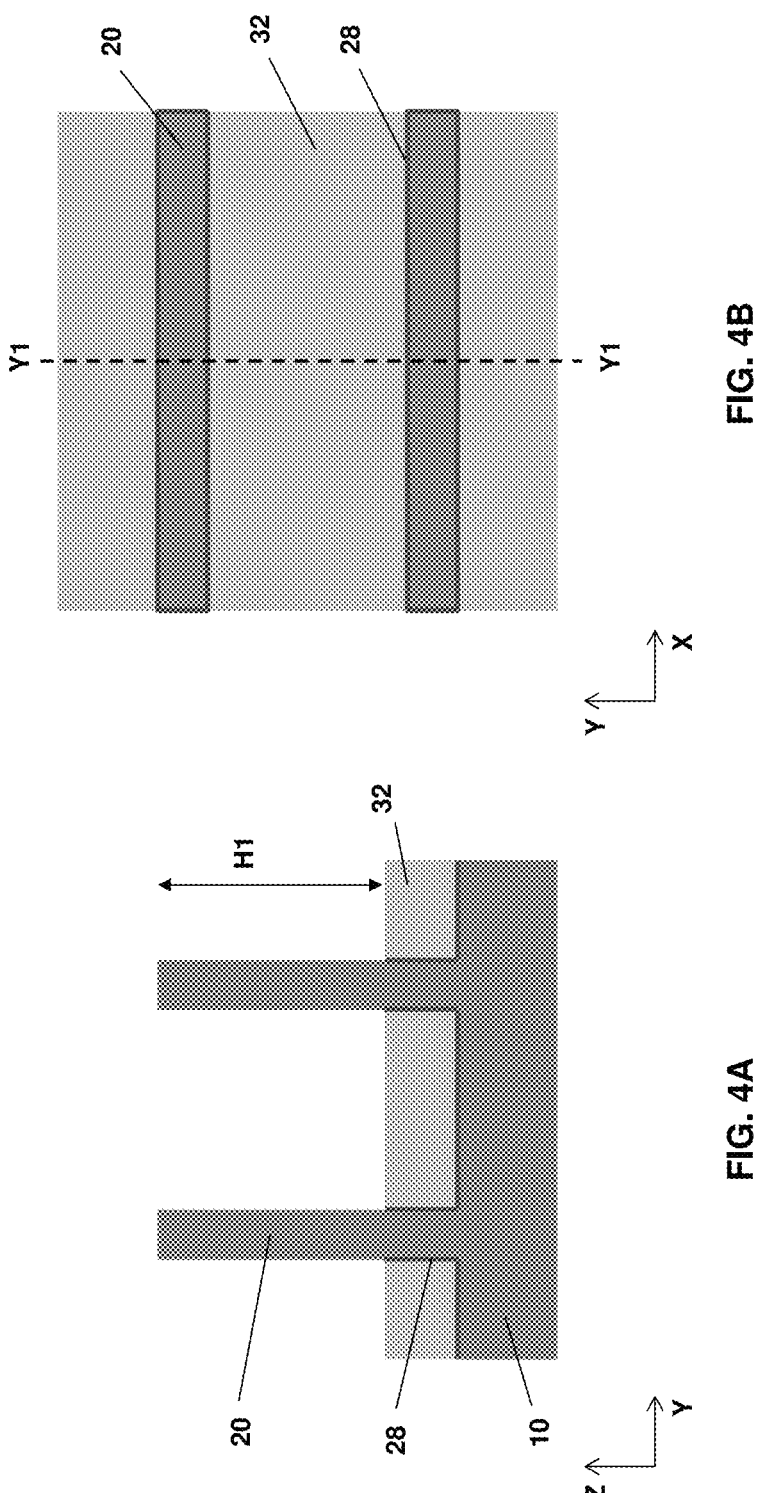
FIGS. 4A and 4B show one of various stages for manufacturing a semiconductor device according to embodiments of the present disclosure.

In some embodiments, one or more fin liner layers 28 are formed over the fin structures before forming the first insulating material layer 29. The fin liner layer 28 may be made of silicon nitride or a silicon nitride-based material (e.g., SiON or SiCN). FIGS. 4A and 4B show one of the various stages of sequential processes for manufacturing a semiconductor device having FinFETs with a flat-top source/drain epitaxial layer according to an embodiment of the present disclosure. FIG. 4A is a cross sectional view corresponding to line Y1-Y1 of FIG. 4B.

Then, as shown in FIG. 4A, the first insulating material layer 29 is recessed to form a first isolation insulating layer 32 so that the upper portions of the fin structures 20 are exposed. With this operation, the fin structures 20 are electrically separated from each other by the first isolation insulating layer 32, which is also called a shallow trench isolation (STI). After the recess etching, the height H1 of the exposed fin structures is in a range from about 50 nm to about 100 nm in some embodiments, and is in a range from about 60 nm to about 80 nm in other embodiments.

Figure 6:
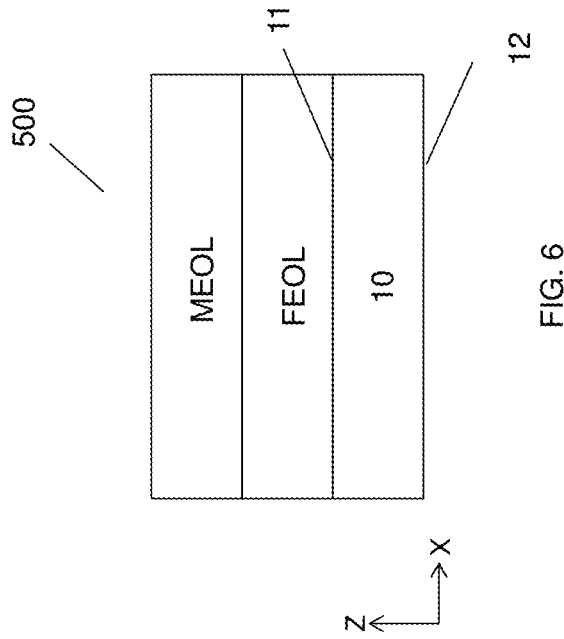
FIG. 6 shows one of various stages for manufacturing a semiconductor device according to embodiments of the present disclosure.
Figure 5:
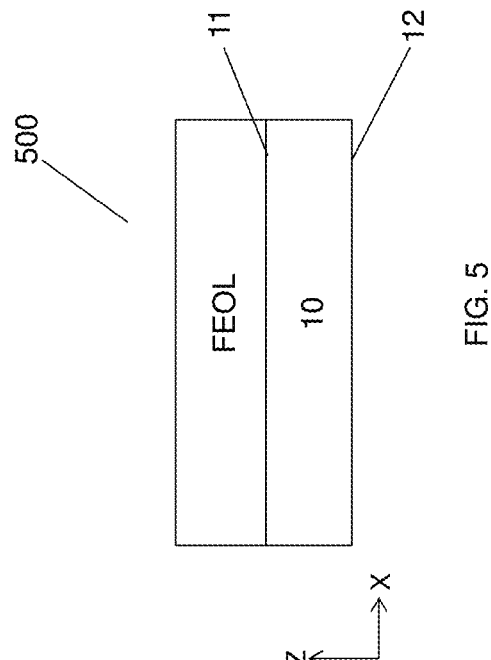
FIG. 5 shows one of various stages for manufacturing a semiconductor device according to embodiments of the present disclosure.
Figure 7:
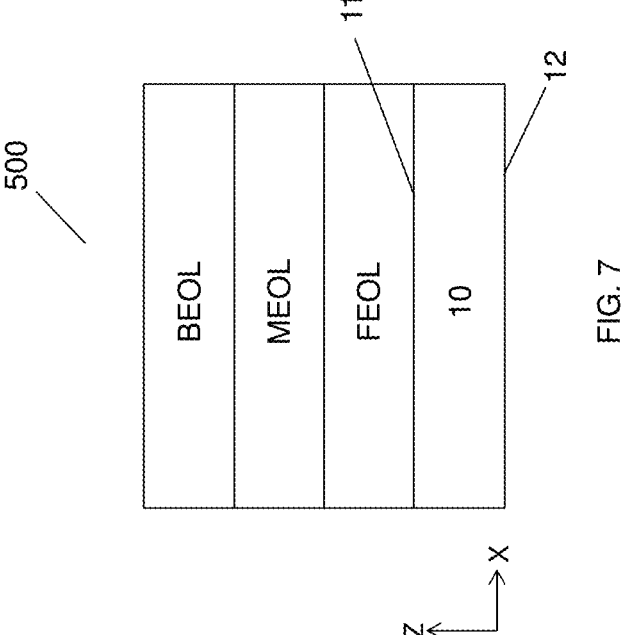
FIG. 7 shows one of various stages for manufacturing a semiconductor device according to embodiments of the present disclosure.

FIGS. 5-7 show views of various stages for manufacturing a semiconductor device 500 according to embodiments of the present disclosure. A semiconductor device 500 includes a semiconductor substrate, such as a semiconductor wafer 10 having a wafer backside 12 and a wafer frontside 11. In some embodiments, fin structures 20 are formed over the wafer frontside 11 (see FIGS. 9-18). A Front End Of Line (FEOL) structure, a Middle End Of Line (MEOL) structure, and a Back End Of Line (BEOL) structure are sequentially formed. The FEOL structure is formed over the wafer frontside 11, the MEOL structure is formed over the FEOL structure, and the BEOL structure is formed over the MEOL structure. Transistors 20 including active regions 22 (such as source/drain regions) can be formed in the substrate 10 and/or the FEOL structure of the semiconductor device 500. Source and drain are used interchangeably in this disclosure.

Figure 8:
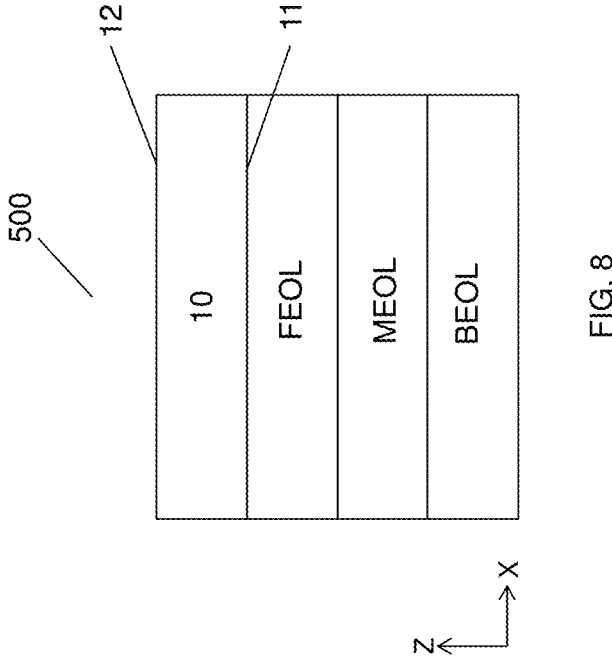
FIG. 8 shows one of various stages for manufacturing a semiconductor device according to embodiments of the present disclosure.

In FIG. 8, the semiconductor device 500 in FIG. 7 is flipped and thus the backside 12 of the wafer 10 facing up in the Z direction.

FIGS. 9-18 show views of various stages for manufacturing a semiconductor device 900 including a field effect transistor (FET) 20 according to embodiments of the present disclosure.

Figure 9:
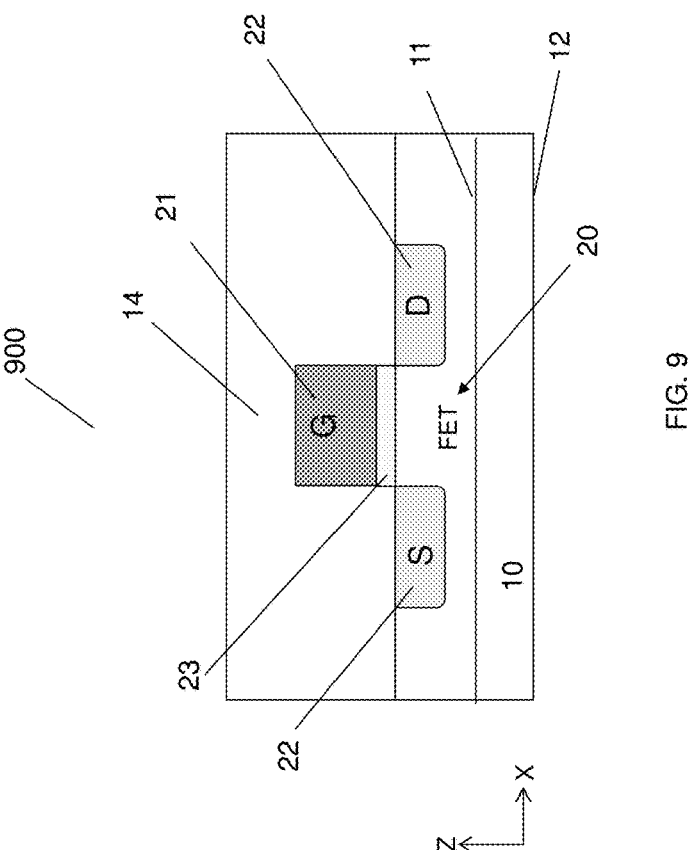
FIG. 9 shows one of various stages for manufacturing a semiconductor device according to embodiments of the present disclosure.

FIG. 9 shows a metal oxide semiconductor field effect transistor (MOSFET) 20 including a gate structure 21, source/drains 22, and a gate dielectric 23 is formed over the substrate of the semiconductor device 900. The substrate 10 has a first surface 11 and a second surface (e.g., a backside) 12. In some embodiments, an interlayer dielectric (ILD) layer 14 is formed over the gate structure 21. The MOSFET disclosed herein is not limited to FinFET configurations. In some embodiments, the MOSFET is a planar FET, a trench FET, a GAA FET, or a multi-bridge channel FET.

In some embodiments, the source/drain regions 22 are made of doped Si, Ge, SiGe, SiSn, GeSn, SiGeSn, or SiGeB epitaxial layers. In some embodiments, the epitaxial layers are doped with B, P, As, or Sb.

In some embodiments, the gate dielectric layer 23 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer includes an interfacial layer formed between the channel layers and the dielectric material, by using chemical oxidation.

The gate dielectric layer 23 may be formed by CVD, ALD or any suitable method. In one embodiment, the gate dielectric layer 23 is formed using a highly conformal deposition process such as ALD in order to ensure the formation of a gate dielectric layer having a uniform thickness around each channel layers. The thickness of the gate dielectric layer 23 is in a range from about 1 nm to about 6 nm in some embodiments.

The gate electrode layer 21 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) are interposed between the gate dielectric layer 23 and the gate electrode layer 21. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 10:
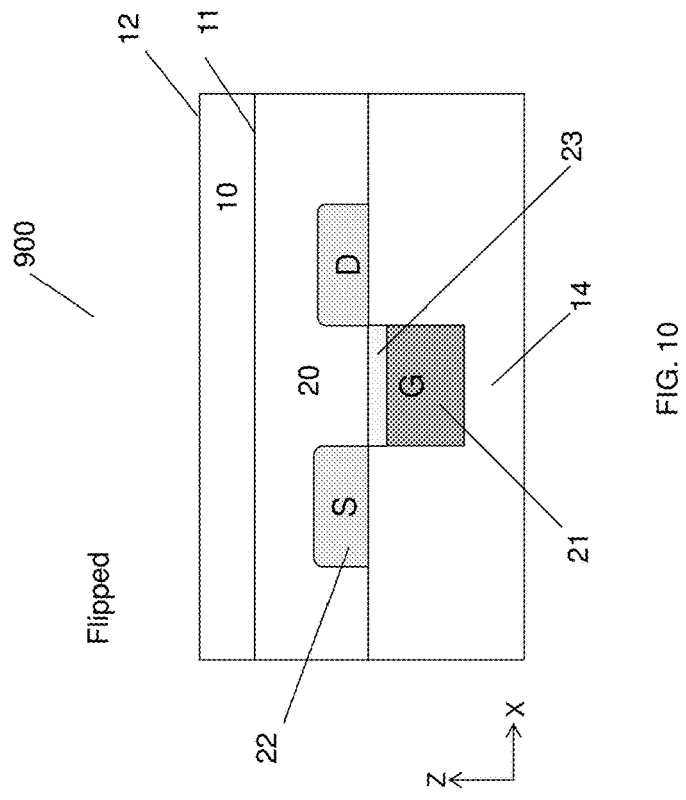
FIG. 10 shows one of various stages for manufacturing a semiconductor device according to embodiments of the present disclosure.

FIG. 10 shows the semiconductor device 900 is flipped, and thus is upside-down relative to the orientation of the semiconductor device illustrated in FIG. 9. In some embodiments, the backside 12 of the substrate 10 is thinned after forming the transistor 20. In some embodiments, the backside 12 is thinned by an etching operation or a chemical-mechanical polishing (CMP) operation.

Figure 11:
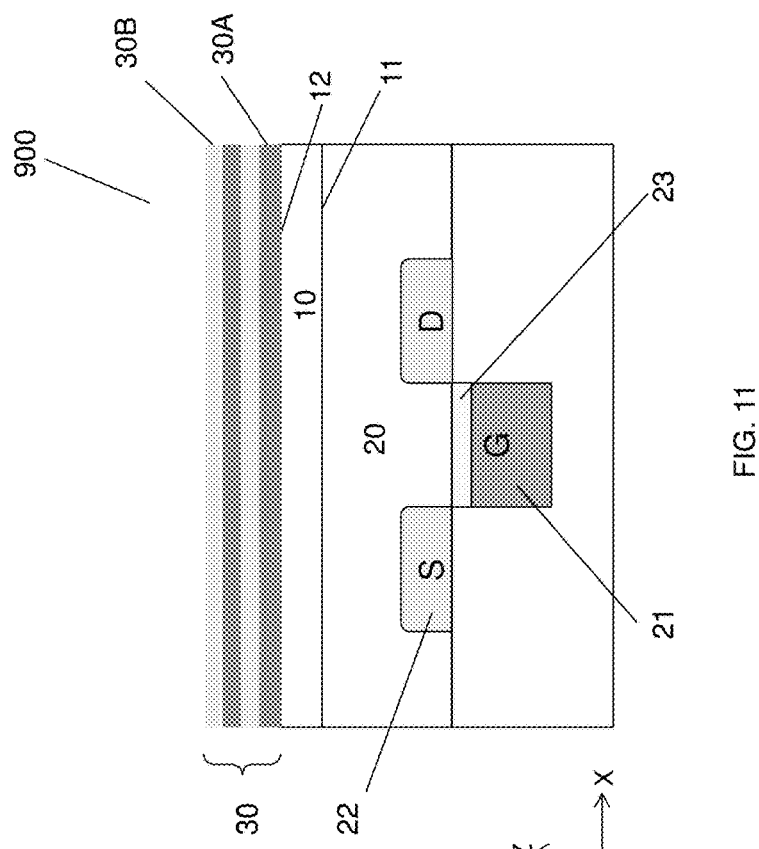
FIG. 11 shows one of various stages for manufacturing a semiconductor device according to embodiments of the present disclosure.

FIG. 11 shows a distributed Bragg reflector (DBR) 30 formed on the wafer backside 12 of the semiconductor device 900 according to embodiments of the present disclosure. The distributed Bragg reflector 30 includes a stack of a multiple number N of pairs of a first material 30A and a second material 30B having different refractive indices on an outside surface of the wafer backside 12. In some embodiments, N is two or greater. In some embodiments, N is three and the distributed Bragg reflector 30 with 3 alternating pairs of the first material 30A and second material 30B blocks over 99% of the incident annealing laser light.

The first material 30A has a first refractive index $n_1$ and the second material 30B has a second refractive index $n_2$. The first refractive index $n_1$ of the first material 30A is different from the second refractive index $n_2$ of the second material 30B.

In some embodiments, the first material 30A includes an amorphous silicon (a-Si), and the second material 30B includes a silicon oxide (such as $SiO_2$) or a silicon nitride (such as $Si_3N_4$).

In some embodiments, where the first material is amorphous silicon, the thickness of the first material layer 30A ranges from about 5 nm to about 50 nm. In some embodiments, where the second material is silicon dioxide, the thickness of the second material layer 30B ranges from about 50 nm to about 130 nm. In some embodiments, where the second material is silicon nitride, the thickness of the second material layer 30B ranges from about 30 nm to about nm. At thicknesses below the specified ranges there may be insufficient reflection of the laser radiation. At thicknesses above the specified ranges, the distributed Bragg reflector may be unnecessarily thick, resulting in an unnecessary increase in device cost.

According to some embodiments of the present disclosure, the first material layer and the second material layer 30B are deposited by low pressure chemical vapor deposition (LPCVD), plasma-enhanced chemical vapor deposition (PECVD), flowable chemical vapor deposition, physical vapor deposition (PVD), such as sputtering, or atomic layer deposition (ALD).

The refractive index of a material may vary at different wavelengths of light. Table 1 below shows an example of the refractive indices for embodiments of the disclosure for different materials of the distributed Bragg reflector layers and the layer thickness for a specific wavelength of laser radiation (e.g., 532 nm).

TABLE 1

| ($\lambda$ = 532 nm) | | |
|---|---|---|
| Material | Refractive Index | Thickness d (nm) |
| a-Si | 4.42 | 30.1 |
| SiO$_2$ | 1.4607 | 91.1 |
| Si$_3$N$_4$ | 2.027 | 65.6 |

Formula 1 below shows that the thicknesses (e.g., d$_{a-Si}$) of the first and second material (e.g., a-Si) layers in the distributed Bragg reflector 30 are a function of the wavelength of the incident laser light ($\lambda$) and the refractive index (e.g., 4.42) of the material.

$$d_{a-Si} = \frac{\lambda}{4n_{a-Si}} \quad d_{SiN} = \frac{\lambda}{4n_{a-Si}} \quad d_{SiO2} = \frac{\lambda}{4n_{a-Si}} \quad (1)$$

The number N of pairs of the alternating first material layer 30A and second material layer 30B in the distributed Bragg reflector 30 also plays a role on the reflectance of the distributed Bragg reflector 30. In some embodiments, the distributed Bragg reflector 30 includes two or more pairs of the alternating first material layer 30A and second material layer 30B.

According to other embodiments of the present disclosure, the first material 30A includes amorphous silicon and the second material 30B includes a silicon oxide (e.g., SiO$_2$). Table 2 below shows a relationship of a reflectance of the distributed Bragg reflector 30, the number N of pairs of the alternating first material 30A (e.g., amorphous silicon) and second material (e.g., silicon oxide) in the distributed Bragg reflector 30, and the total thickness (nm) of the distributed Bragg reflector 30. As shown in Table 2, when the alternating layers are amorphous silicon and silicon oxide, one pair of layers reflects about 90% of the incident laser radiation, two pairs of alternating layers reflect over 98% of the incident laser radiation, and three pairs of alternating layers reflect over 99% of the incident laser radiation.

TABLE 2

| Number of DBR pairs | 1 | 2 | 3 |
|---|---|---|---|
| Reflectance | 0.90011 | 0.98857 | 0.99875 |
| Total thickness (nm) | 121.1 | 242.3 | 363.4 |

According to other embodiments of the present disclosure, the first material 30A includes amorphous silicon and the second material 30B includes silicon nitride (e.g., Si$_3$N$_4$). Table 3 below shows a relationship of a reflectance of the distributed Bragg reflector 30, the number N of pairs of the alternating first material 30A (e.g., amorphous silicon) and second material 30B (e.g., silicon nitride) in the distributed Bragg reflector 30, and the total thickness (nm) of the distributed Bragg reflector 30. As shown in Table 3, when the alternating layers are amorphous silicon and silicon nitride, one pair of layers reflects over 80% of the incident laser radiation, two pairs of alternating layers reflect over 95% of the incident laser radiation, and three pairs of alternating layers reflect over 99% of the incident laser radiation.

TABLE 3

| Number of DBR pairs | 1 | 2 | 3 |
|---|---|---|---|
| Reflectance | 0.81647 | 0.95829 | 0.99108 |
| Total thickness (nm) | 95.7 | 191.4 | 287.1 |

From Table 2 and Table 3, it is noted that the distributed Bragg reflector 30 with 3 pairs of the alternating first material 30A and second material 30B blocks over 99% of the incident annealing laser light so that only less than 1% of the incident annealing laser light can penetrate through the distributed Bragg reflector 30. The distributed Bragg reflector 30 can function as a hard-mask to greatly reduce heat generated by the annealing laser light at regions (metal gates (MGs), and M0/M1/M2 BEOL interconnects, for example) covered or blocked by the distributed Bragg reflector 30. In some embodiments, the distributed Bragg reflector 30 includes two pairs of alternating layers 30A, 30B with different indices of refraction. In other embodiments, the distributed Bragg reflector 30 includes three pairs alternating layers 30A, 30B. In other embodiments, more than three pairs of alternating layers 30A, 30B are included in the distributed Bragg reflector 30.

Formula 2 below shows the reflectance (R) of the distributed Bragg reflector 30 is a function of the number N of pairs of the alternating first material 30A (e.g., amorphous silicon) and second material 30B (e.g., silicon nitride).

$$R = \left[\frac{n_o(n_2)^{2N} - n_s(n_1)^{2N}}{n_o(n_2)^{2N} + n_s(n_1)^{2N}}\right]^2 \quad (2)$$

In formula (2), where n$_0$, n$_1$, n$_2$, and n$_s$ are the respective refractive indices of the originating medium (the ambient outside the semiconductor device 900, for example, in a vacuum ambient), the two alternating material layers (the first material layer 30A and the second material layer 30B), and the terminating medium (i.e., backing or substrate wafer 10 of the semiconductor device 900), and N is the number of repeated pairs of different refractive index materials.

Figure 12:
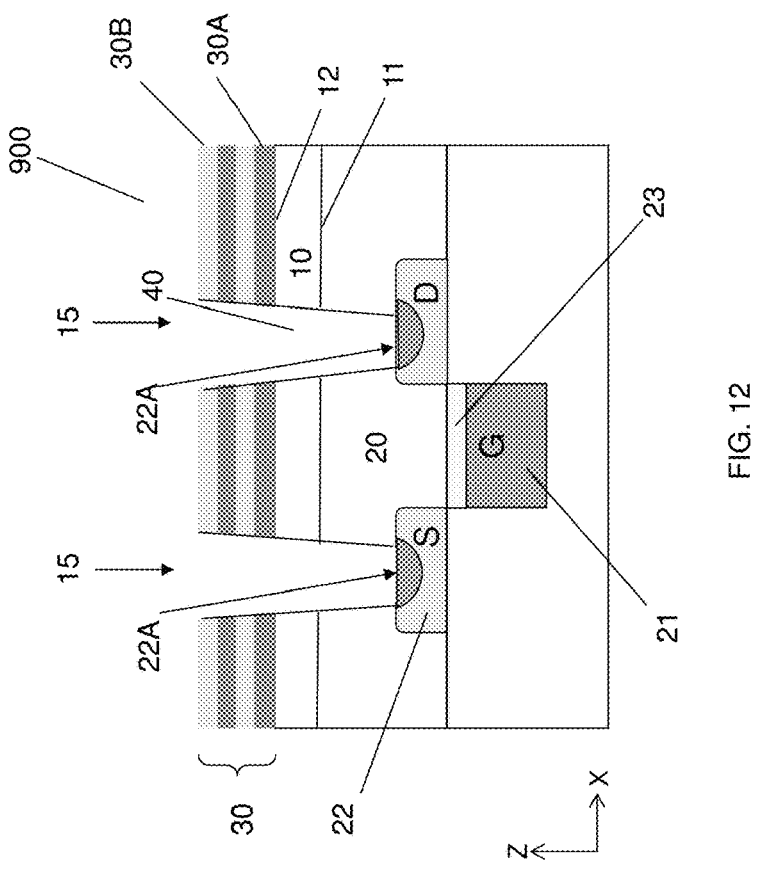
FIG. 12 shows one of various stages for manufacturing a semiconductor device according to embodiments of the present disclosure.

FIG. 12 shows an opening 40 formed from the backside 12 of the semiconductor device 900, through the distributed Bragg reflector 30 and the wafer 10, to expose the source/drain region 22 of the semiconductor device 900 according to embodiments of the present disclosure. Various methods of photolithography and etching can be used to form the opening 40 extending from an outside surface of the distributed Bragg reflector 30 to expose a portion of the source/drain region 22 of the semiconductor device 900.

FIG. 12 also shows doping, such as by ion-implanting, dopants 15 through the opening 40 into a portion 22A of the source/drain region 22 according to embodiments of the present disclosure. In some embodiments, the source/drain region 22 is made of SiGeB, and the dopants 15 include Ge and B. In some embodiments, the Ge implantation amorphizes the source/drain region 22 and the B implantation increases the B concentration in the source/drain region 22. However, ion-implanting dopants 15 into the source/drain region 22 may cause issues such as lattice disorders in some portions of the doped source/drain region 22.

Figure 13:
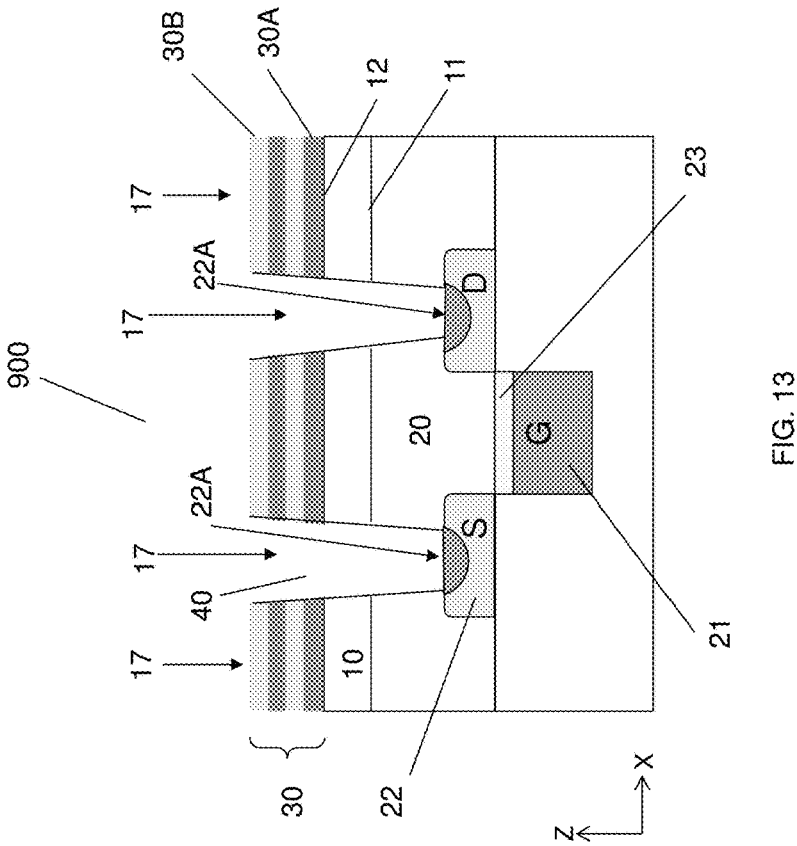
FIG. 13 shows one of various stages for manufacturing a semiconductor device according to embodiments of the present disclosure.

After ion implantation, the source/drain region 22 is subsequently annealed to repair lattice disorders and activate the source/drain region. FIG. 13 shows laser annealing the implanted or doped source/drain region 22 of the semiconductor device 900 by using laser radiation 17 according to embodiments of the present disclosure. The wavelength (A) of the laser radiation is in a range from about 512 nm to about 552 nm in some embodiments. The laser radiation 17 radiates the doped source/drain region 22A through the opening 40 in a time range from about 1 nano-second to about 100 milli-seconds for example. The laser radiation 17 radiates through the opening 40 to heat the doped source/drain region 22A of the semiconductor device 900 to a temperature in a range of about 600° C. to about 1200° C. in some embodiments.

The distributed Bragg reflector 30 formed on the wafer backside 12 of the semiconductor device 900 functions a laser radiation reflector. When incident annealing laser radiation 17 is directed onto an outside surface of the distributed Bragg reflector 30, the distributed Bragg reflector 30 substantially reflects all (e.g., >98%) of the incident laser radiation away from the backside 12 of the semiconductor device 900. Therefore, the amount of the laser radiation 17 passing through the distributed Bragg reflector 30 and impinging on other components of the semiconductor device 900 is greatly reduced. Thus, the distributed Bragg reflector 30 protects regions or structures of the semiconductor device 900 covered by the distributed Bragg reflector 30 from being over-heated and damaged by the annealing laser radiation 17.

Figure 14:
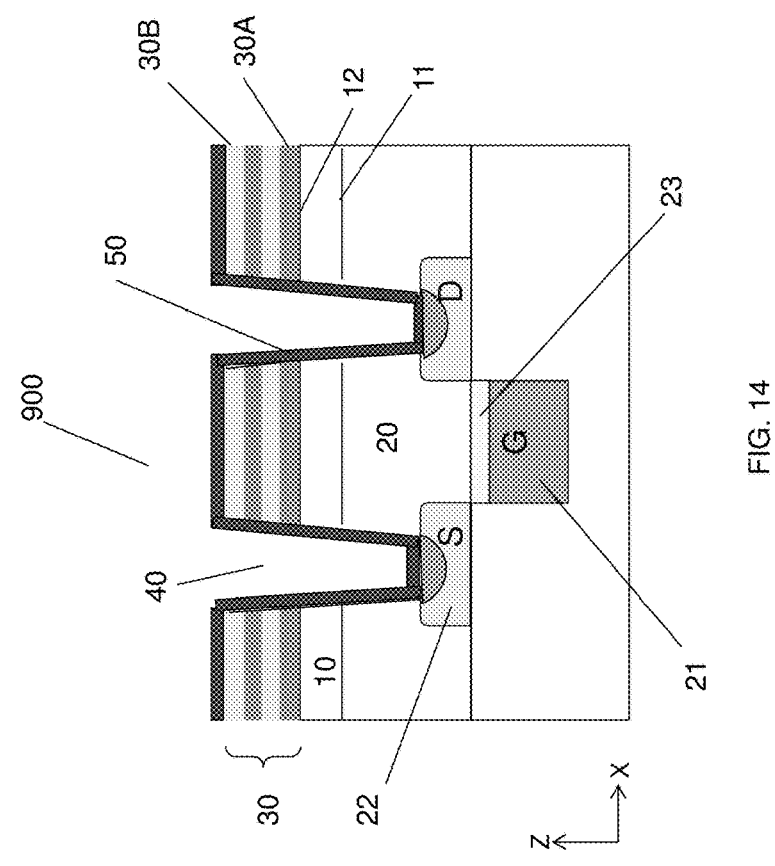
FIG. 14 shows one of various stages for manufacturing a semiconductor device according to embodiments of the present disclosure.

Next an insulating liner 50 is formed on the outside surface of the distributed Bragg reflector 30, and side walls and the bottom of the opening 40, as shown in FIG. 14. In some embodiments, the insulating liner 50 is made of silicon nitride. According to embodiments of the present disclosure, the insulating liner 50 is formed by chemical vapor deposition (CVD), or physical vapor deposition (PVD).

Figure 15:
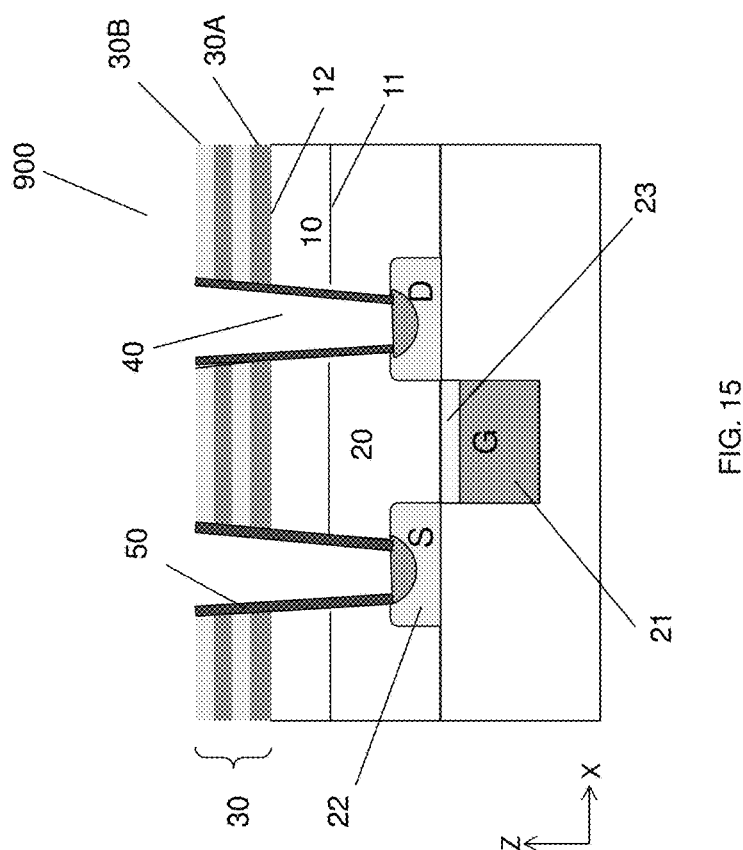
FIG. 15 shows one of various stages for manufacturing a semiconductor device according to embodiments of the present disclosure.

As shown in FIG. 15, portions of the insulating liner 50 formed on the outside surface of the distributed Bragg reflector 30 and on the bottom of the opening 40 are removed by etching according to some embodiments of the present disclosure. In some embodiments, the portions of the insulating liner 50 formed on the horizontal surfaces is removed by an anisotropic etching operation.

Figure 16:
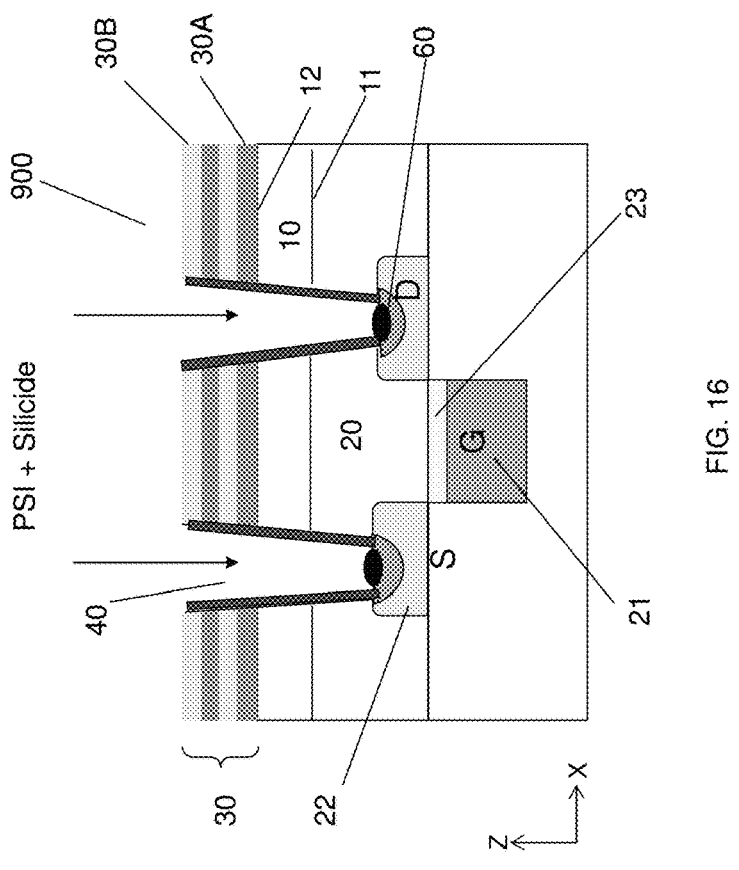
FIG. 16 shows one of various stages for manufacturing a semiconductor device according to embodiments of the present disclosure.
Figure 17:
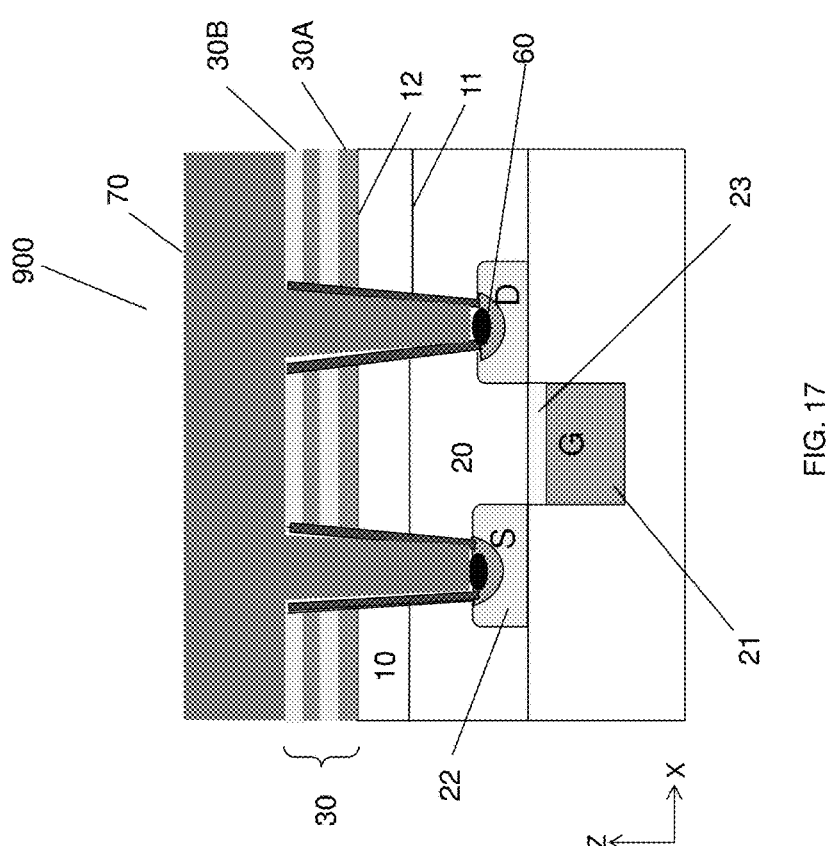
FIG. 17 shows one of various stages for manufacturing a semiconductor device according to embodiments of the present disclosure.

In some embodiments, a pre-silicide implantation (PSI) operation is applied to the source/drain region 22 through the opening 40, as shown in FIG. 16. Then, a metal layer is deposited on the exposed top surface of the source/drain region 22. The metal layer is heated to a temperature sufficient to initiate a silicidation for a period of time sufficient to form a metal silicide 60 on the top surface of the source/drain region 22. The metal silicide 60 reduces contact resistance of a subsequently formed source/drain contact 70 to the source/drain region 22 (see e.g., FIG. 18). In some embodiments, the metal layer is formed of W, Co, Ni, Ti, Mo, Ta, or combinations thereof, and the subsequently formed metal silicide 60 includes one or more of WSi, CoSi, NiSi, TiSi, MoSi and TaSi. In some embodiments, the metal layer is formed by CVD, PVD, ALD, or electroplating. A metal material is subsequently filled into the opening 40 to form a wafer backside conductive via 70, which can be used as a source/drain contact via, as shown in FIG. 17. The metal material is selected from W, Co, Ru, W, Cu, Al, Ti, Ta, Mo, Ni, or Co according to embodiments of the present disclosure. In some embodiments, the metal material is formed by CVD, PVD, ALD, or electroplating.

Figure 18:
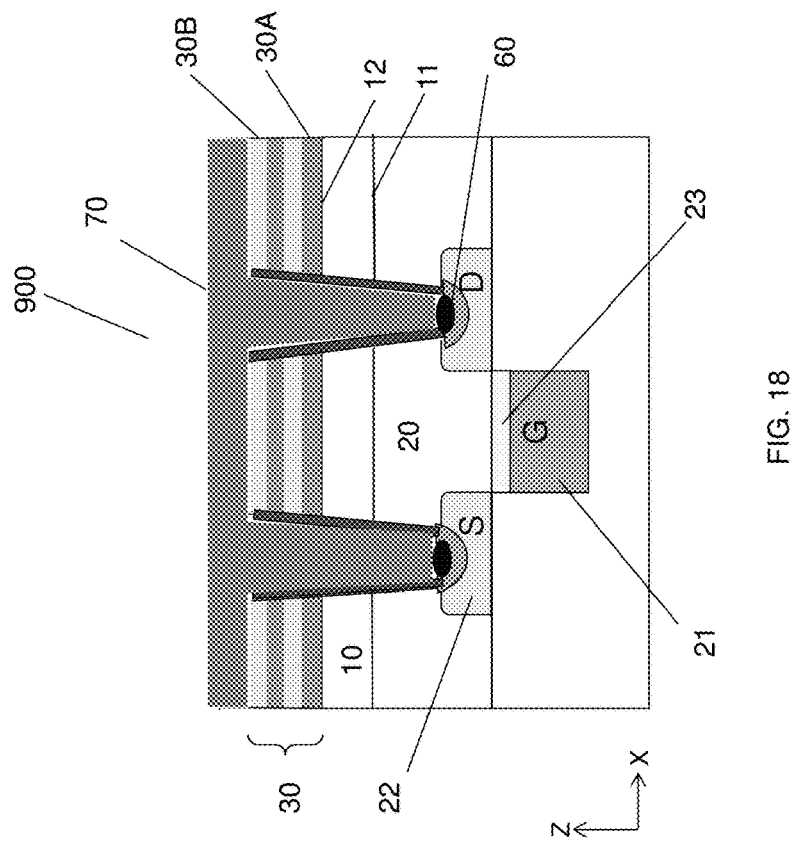
FIG. 18 shows one of various stages for manufacturing a semiconductor device according to embodiments of the present disclosure.

FIG. 18 shows the metal material of the conductive via 70 is subsequently polished by chemical mechanical polishing (CMP) to create an even surface for future or next-step formation of other structures according to embodiments of the present disclosure.

FIGS. 19A-24B show sequential processes for manufacturing a semiconductor device having GAA FETs according to another embodiment of the present disclosure. It is understood that additional operations can be provided before, during, and after processes shown by FIGS. 19A-24B, and some of the operations described below can be replaced or eliminated, for additional embodiments of the method. The order of the operations/processes may be interchangeable. The A drawings (19A, 20A, etc.) are cross sectional views corresponding to lines Y1-Y1 of the plan view B drawings (19B, 20B, etc.)

Figure 19B:
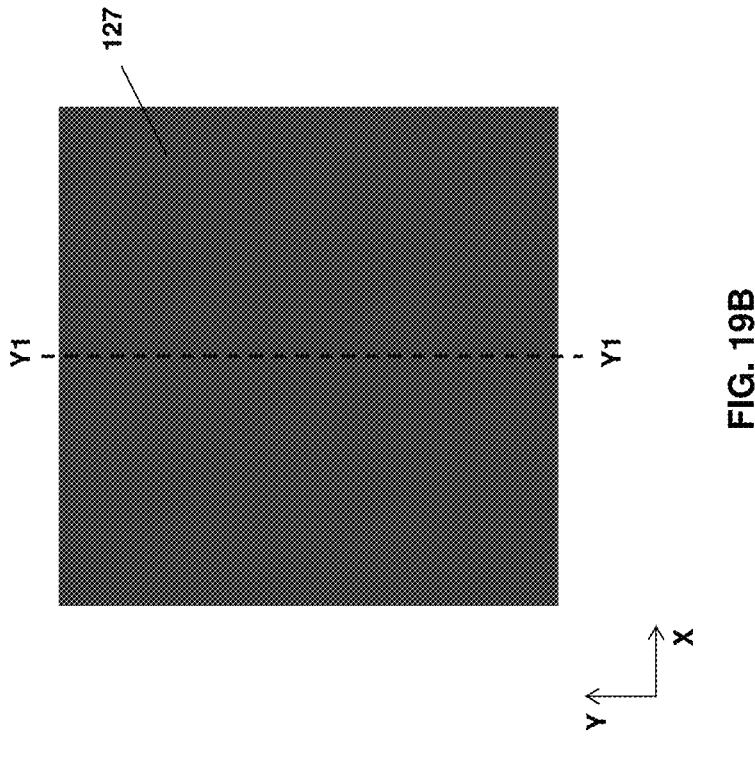
FIGS. 19A and 19B show one of various stages for manufacturing a semiconductor device according to embodiments of the present disclosure.
Figure 19A:
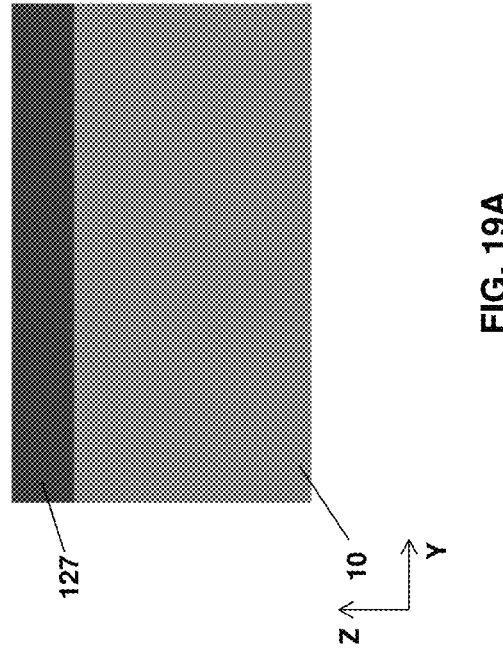
Figure 20B:
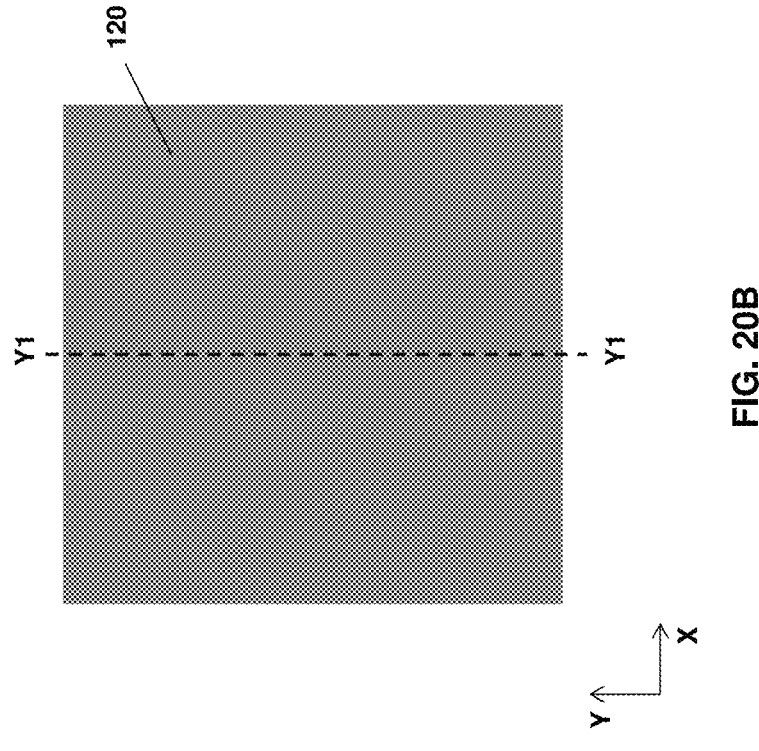
FIGS. 20A and 20B show one of various stages for manufacturing a semiconductor device according to embodiments of the present disclosure.
Figure 20A:
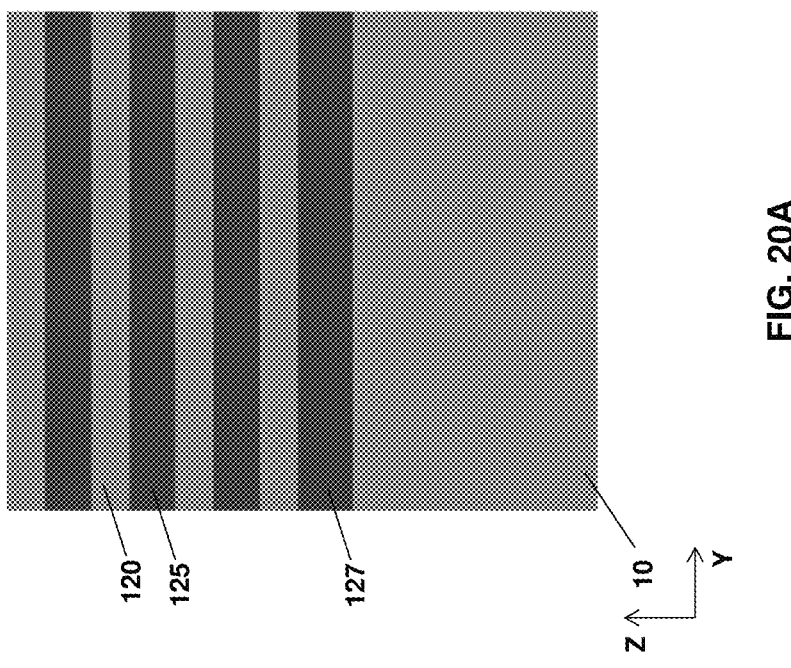

As shown in FIG. 19A, a buffer semiconductor layer 127 is formed over a substrate 10. Then, first semiconductor layers 120 and second semiconductor layer 125 are alternately stacked over the buffer layer 127 as shown in FIGS. 20A and 20B.

In some embodiments, the substrate 10 is Si, the first semiconductor layers 120 are Si, and the buffer semiconductor layer 127 and second semiconductor layer 125 are $Si_{1-z}Ge_z$, where $0.2<z<0.7$. In other embodiments, the substrate 10 is Si, the first semiconductor layers 120 are Ge or $Si_{1-x}Ge_x$, where $0.5<x<1$, and the buffer semiconductor layer 127 and second semiconductor layer 125 are $Si_{1-z}Ge_z$, where $0.2<z<0.7$ and $z<x$. In other embodiments, the semiconductor material of the buffer layer 127 and that of the second semiconductor layer are different. The buffer semiconductor layer 127, the first semiconductor layer 120 and the second semiconductor layer 125 are epitaxially formed by using CVD, (molecular beam epitaxy) MBE, ALD or any other suitable methods. In some embodiments, no buffer semiconductor layer 127 is formed.

Figures 21A, 21B:
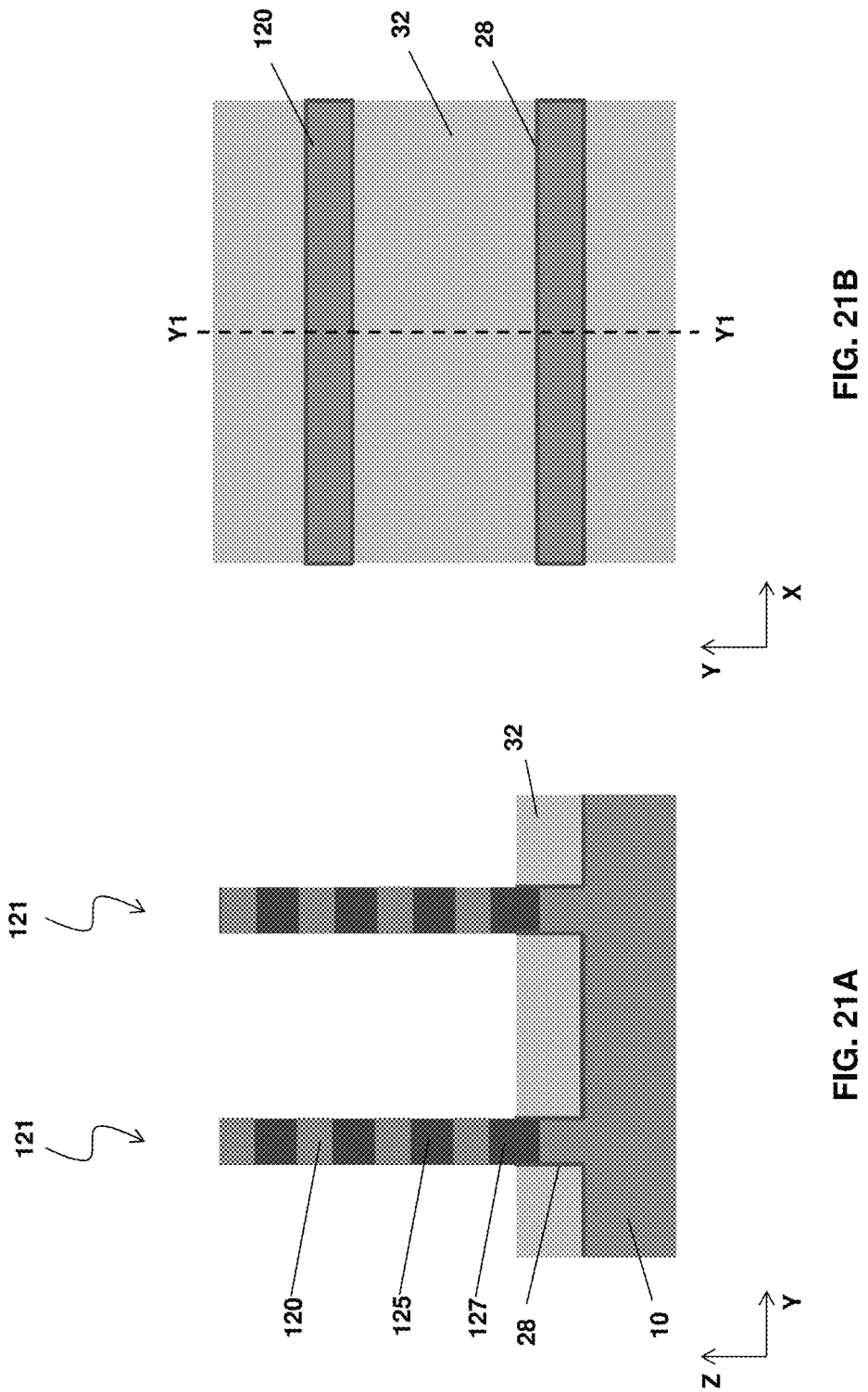
FIGS. 21A and 21B show one of various stages for manufacturing a semiconductor device according to embodiments of the present disclosure.

By using the similar operations explained with respect to FIGS. 2A-4B, fin structures 121 protruding from the isolation insulating layer 32 are formed, as shown in FIGS. 21A and 21B. FIG. 21A is a cross sectional view corresponding to line Y1-Y1 of FIG. 21B.

As shown in FIG. 21A, the fin structures 121 include multiple layers of the first semiconductor layers 120 and the second semiconductor layers 125 alternately stacked. In some embodiments, the thickness of the buffer semiconductor layer 127 is greater than the thickness of each of the first semiconductor layers 120. Although FIG. 21A shows four first semiconductor layers 120 and three second semiconductor layers 125, the number of the first and second semiconductor layer can be two, three or more than four and up to ten.

After the isolation insulating layer 32 is formed, a dummy gate structure including a dummy gate dielectric layer and a dummy gate electrode layer is formed. The dummy gate dielectric layer includes one or more layers of insulating material, such as a silicon oxide-based material. In one embodiment, silicon oxide formed by CVD is used. The thickness of the dummy gate dielectric layer is in a range from about 1 nm to about 5 nm in some embodiments.

The dummy gate structure is formed by first blanket depositing the dummy gate dielectric layer over the exposed fin structures 121 and the upper surface of the isolation insulating layer 32. A dummy gate electrode layer is then blanket deposited on the dummy gate dielectric layer, such that the fin structures 121 are fully embedded in the dummy gate electrode layer. The dummy gate electrode layer includes silicon such as polycrystalline silicon (polysilicon) or amorphous silicon. In some embodiments, the dummy gate electrode layer is made of polysilicon. The thickness of the dummy gate electrode layer is in a range from about 100 nm to about 200 nm in some embodiments. In some embodiments, the dummy gate electrode layer is subjected to a planarization operation. The dummy gate dielectric layer and the dummy gate electrode layer are deposited using CVD, including LPCVD and PECVD, PVD, ALD, or other suitable process. Subsequently, a mask layer is formed over the dummy gate electrode layer. The mask layer can be a resist pattern or a hard mask pattern.

A blanket layer of an insulating material for sidewall spacers 45 is subsequently conformally formed over the dummy gate structure using CVD or other suitable methods. The blanket layer is deposited in a conformal manner so that it is formed to have substantially equal thicknesses on vertical surfaces, such as the sidewalls, horizontal surfaces, and the top of the dummy gate structures. In some embodiments, the blanket layer is deposited to a thickness in a range from about 2 nm to about 20 nm. In one embodiment, the insulating material of the blanket layer is different from the materials of the first isolation insulating layer and the second isolation insulating layer, and is made of a silicon nitride-based material, such as silicon nitride, SiON, SiOCN or SiCN and combinations thereof. In some embodiments, the blanket layer (sidewall spacers 45) is made of silicon nitride. The sidewall spacers 45 are formed on opposite sidewalls of the dummy gate structures by anisotropic etching.

Subsequently, an interlayer dielectric (ILD) layer 150 is formed over the sidewall spacers 45. The materials for the ILD layer 150 include compounds comprising Si, O, C and/or H, such as silicon oxide, SiCOH and SiOC. Organic materials, such as polymers, may be used for the ILD layer 150. After the ILD layer 150 is formed, a planarization operation, such as CMP, is performed, so that the top portions of the dummy gate electrode layers of the dummy gate structures.

Figures 22A, 22B:
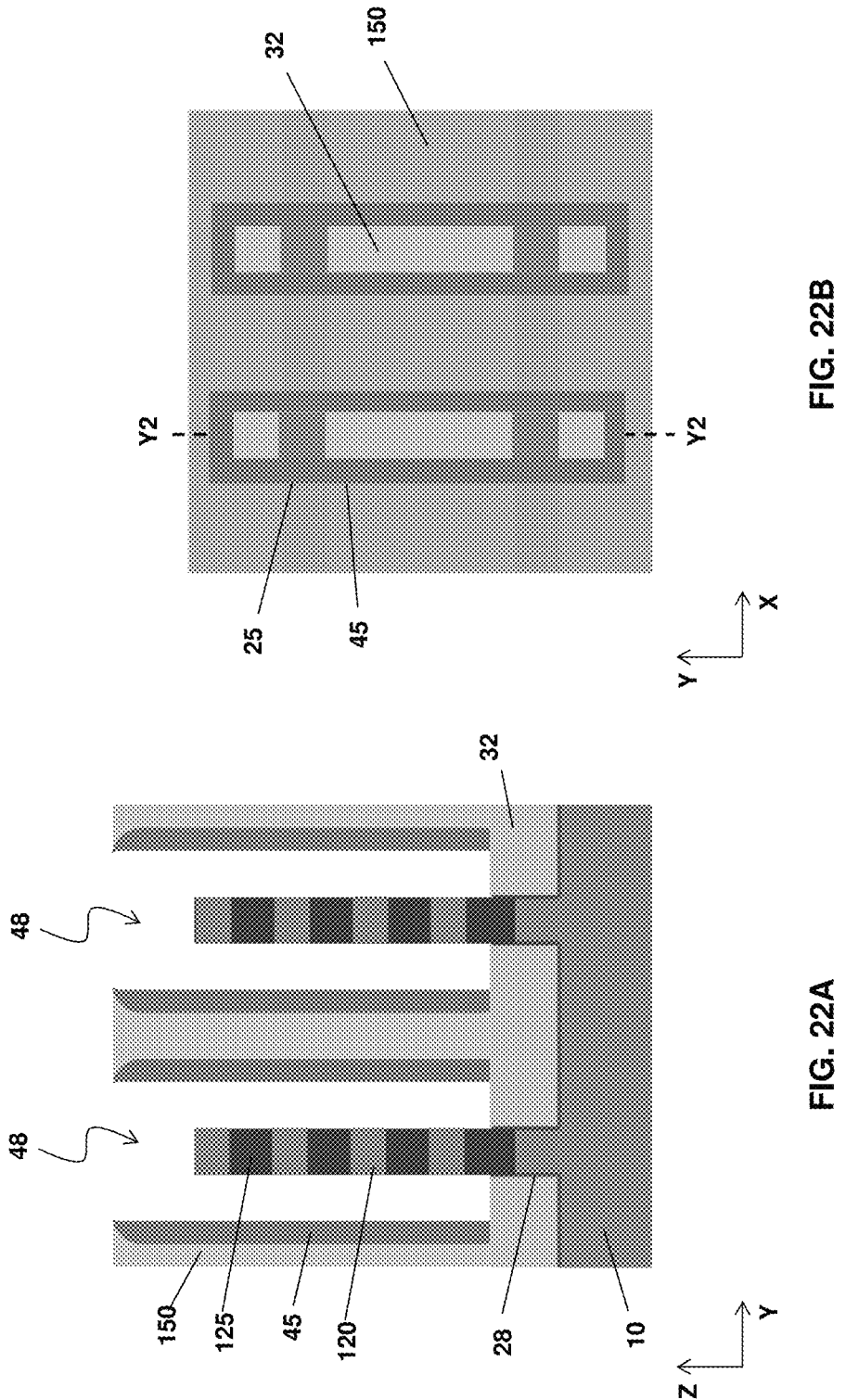
FIGS. 22A and 22B show one of various stages for manufacturing a semiconductor device according to embodiments of the present disclosure.

Gate spaces 48 are subsequently formed by suitable photolithographic and etching operations to remove the dummy gate structures, in which the upper portions of the fin structures 121 are exposed, respectively, as shown in FIGS. 22A and 22B. FIG. 22A is a cross sectional view corresponding to line Y1-Y1 of FIG. 22B. In some embodiments, a part of the buffer semiconductor layer 127 is exposed in the opening 48. In other embodiments, the entire buffer semiconductor layer 127 is exposed, and in certain embodiments, the buffer semiconductor layer 127 is not exposed in the opening 48.

Figures 23A, 23B:
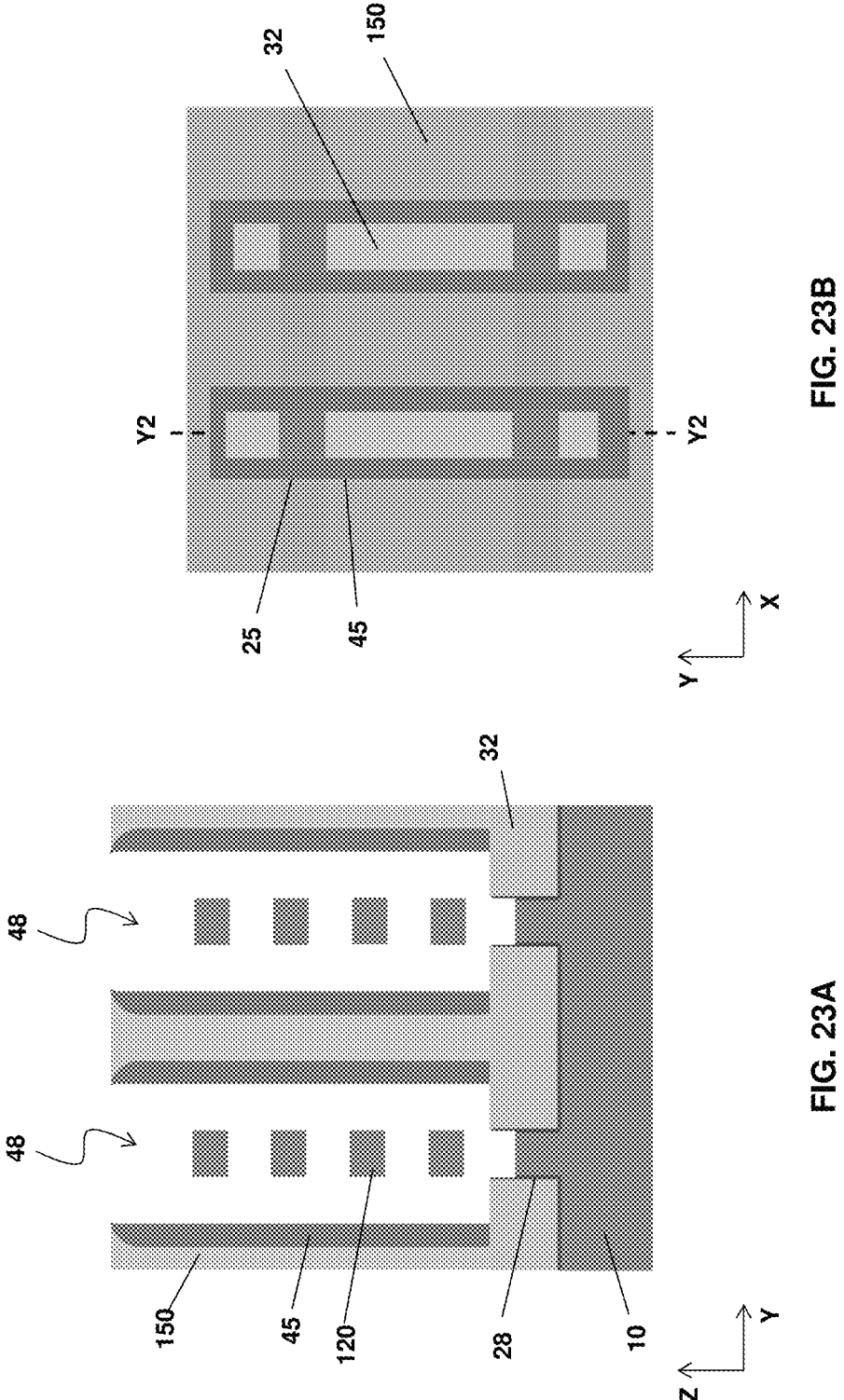
FIGS. 23A and 23B show one of various stages for manufacturing a semiconductor device according to embodiments of the present disclosure.

Then, the buffer semiconductor layer 127 and the second semiconductor layers 125 are removed in the gate opening 48, as shown in FIGS. 23A and 23B. FIG. 23A is a cross sectional view corresponding to line Y1-Y1 of FIG. 29B. The second semiconductor layers 125 can be selectively removed using a wet etchant such as, but not limited to, ammonium hydroxide (NH₄OH), tetramethylammonium hydroxide (TMAH), ethylenediamine pyrocatechol (EDP), or potassium hydroxide (KOH) solution. Thus, semiconductor wires are formed of the first semiconductor layers 120.

Figures 24A, 24B:
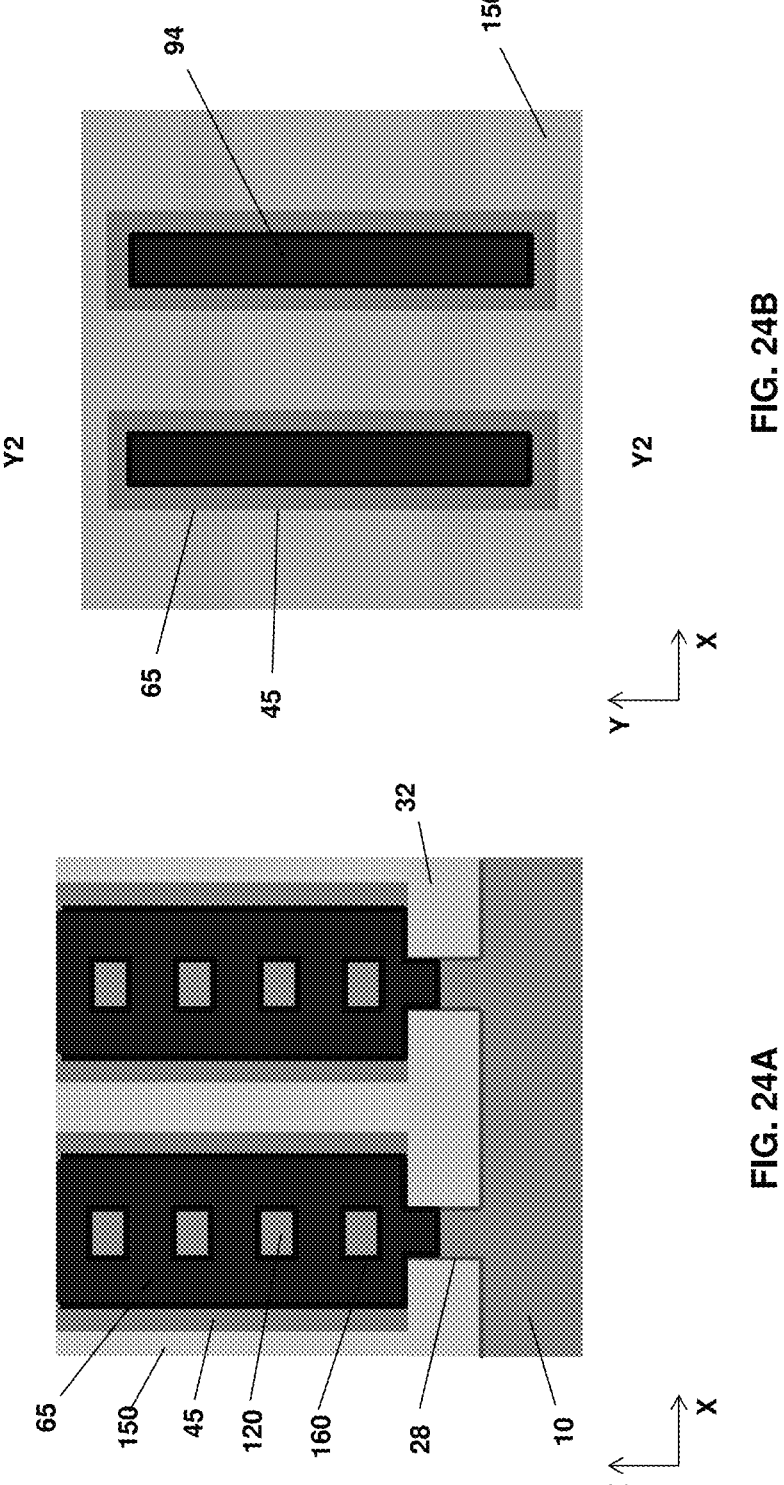
FIGS. 24A and 24B show one of various stages for manufacturing a semiconductor device according to embodiments of the present disclosure.

Then, gate structures 65 are formed, as shown in FIGS. 24A and 24B. FIG. 24A is a cross sectional view corresponding to line Y2-Y2 of FIG. 24B. The gate structures are formed by depositing a gate dielectric layer 160 followed by a gate electrode layer 65. In some embodiments, the gate dielectric layer is formed of any of the high-k dielectric materials disclosed herein with respect to FIG. 9, and the gate electrode layer is formed of any of the gate electrode materials disclosed herein with respect to FIG. 9.

It is understood that the FinFETs and GAA FETs undergo further CMOS processes to form various features such as contacts/vias, interconnect metal layers, dielectric layers, passivation layers, etc.

Figure 25:
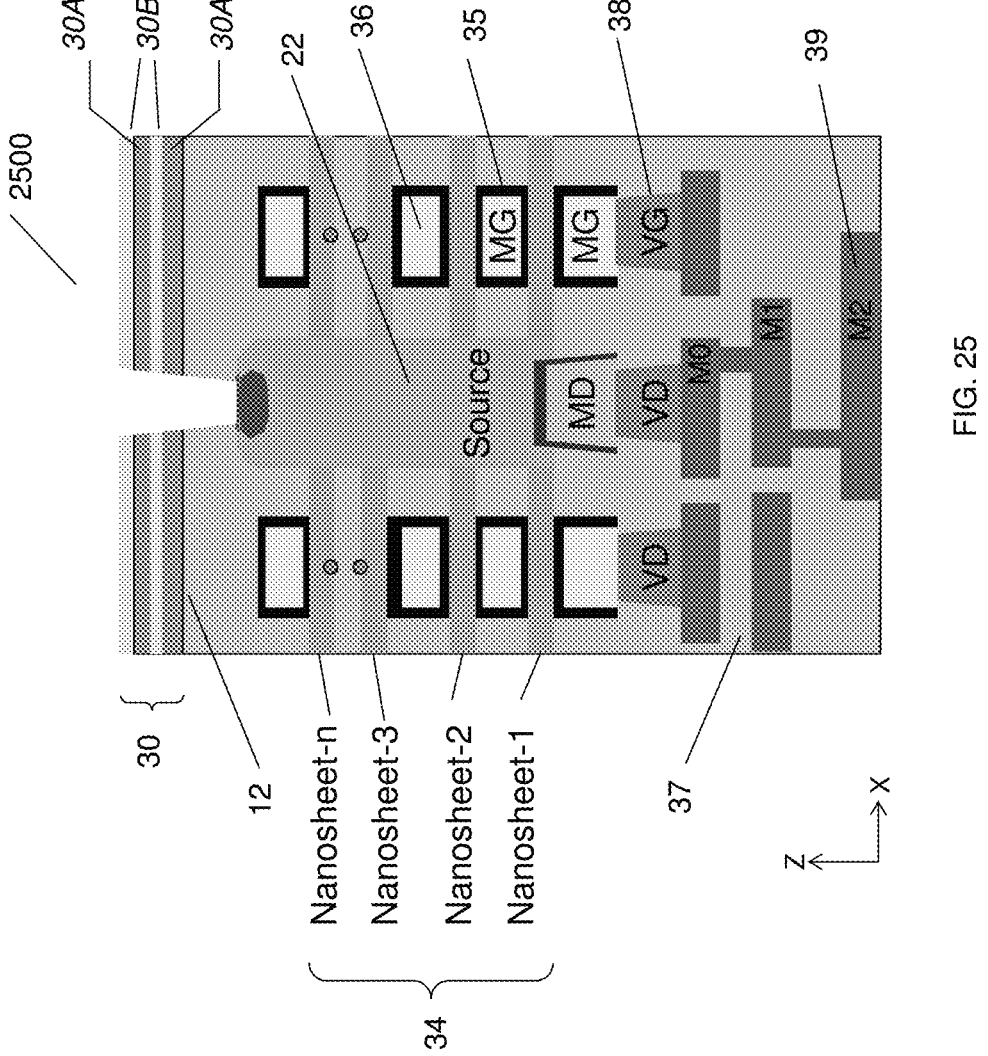
FIG. 25 shows a cross sectional view of a semiconductor device including a gate-all-around field effect transistor (GAA FET) according to embodiments of the present disclosure.

FIG. 25 shows a semiconductor device 2500 that includes a gate-all-around field effect transistor (GAA FET) and other components or structures for example. FIG. 25 shows the structures of a GAA FET that underwent further CMOS processes to form a semiconductor device 2500 including a FEOL, BEOL, and MEOL structures. The orientation of the semiconductor structure is flipped so that the substrate backside faces up. The structure may include source/drain regions 22, several layers of silicon nanosheets 34 (e.g., nanosheet-1, nanosheet-2, nanosheet-3, . . . nanosheet-n) functioning as channels, high-k films 35, and metal gates (MGs) 36 that can be used to control the ON or OFF state of the nanosheets 34. The MEOL structure may include gate-to-metal and drain-to-metal interconnects (such as VD and VG) 38 to interconnect the nanosheets 34. The source/drain 22 can be made of epitaxial materials disclosed herein, including SiGeB. The BEOL structure may include several layers of Cu interconnection lines (such as M0/M1/M2) 39 and low-k dielectric films 37, which can be damaged by high temperature (e.g., higher than 400 C) caused by a laser annealing for example.

Referring to FIG. 25, the distributed Bragg reflector 30 beneficially protects structures or regions such as metal interconnects (e.g., Cu M0/M1/M2) 39 and low-k dielectric films 37 in the BEOL structure, and high-k dielectrics 35 and metal gates (MGs) 36 in the MEOL structure from being overheated and damaged by the annealing laser radiation. Although the semiconductor device 2500 including a gate-all-around field effect transistor is illustrated in FIG. the embodiments of the disclosure are not limited to a semiconductor device including a gate-all-around field effect transistor.

Figure 26:
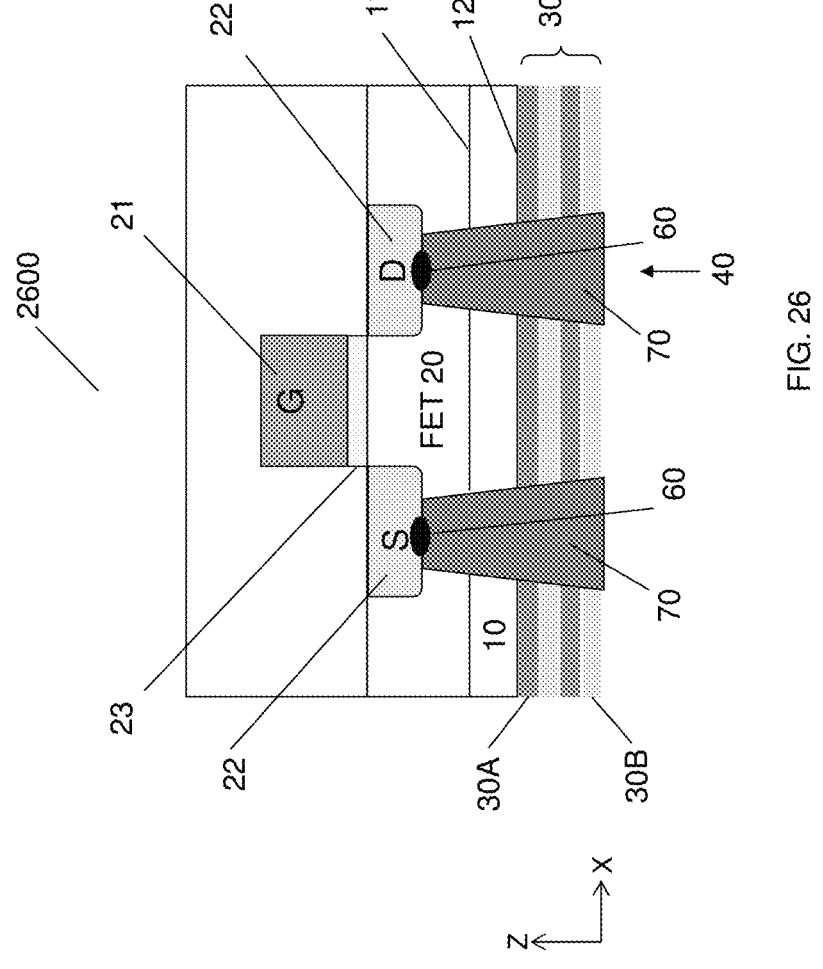
FIG. 26 shows a cross sectional view of a semiconductor device including a fin field effect transistor (FinFET) according to embodiments of the present disclosure.

FIG. 26 shows a cross sectional view of a semiconductor device 2600 according to some embodiments of the present disclosure. The semiconductor device 2600 includes a semiconductor substrate 10 having a first main surface 11 and an opposing second main surface 12 (backside), a field effect transistor (FET) 20, a distributed Bragg reflector 30, and a conductive via 70. The field effect transistor 20 is disposed over the first main surface 11 of the semiconductor substrate 10. The field effect transistor 20 includes a gate structure 21, a source/drain region 22, and a gate dielectric 23. The distributed Bragg reflector 30 is disposed over the opposing second main surface (backside) 12 of the semiconductor substrate 10. The conductive via 70 is disposed in the distributed Bragg reflector 30 and passes through the semiconductor substrate and is in direct electrical contact with the source/drain region 22. The source/drain region 22 of the field effect transistor 20 includes a metal silicide 60 that is formed on the outside surface of the source/drain region 22 that is in contact with the conductive via 70. The metal silicide 60 reduces contact resistance between the source/drain region 22 and the conductive via 70.

Figure 27:
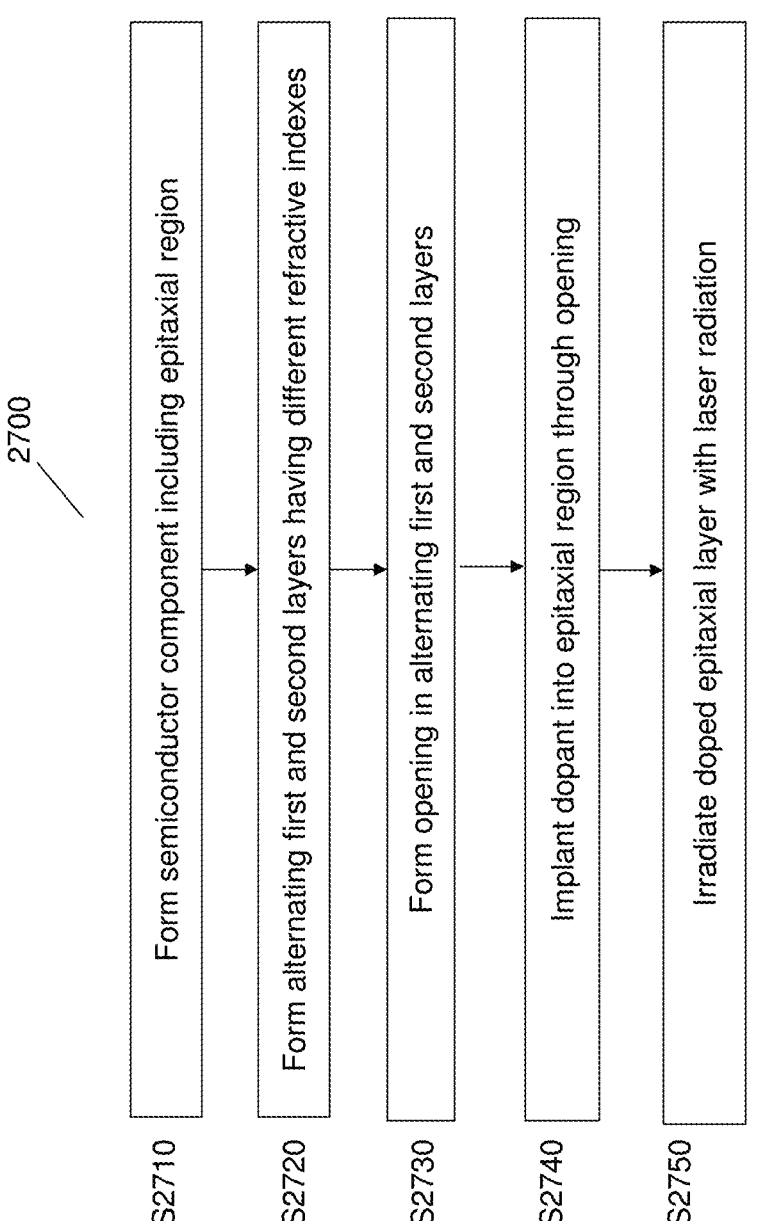
FIG. 27 is a flowchart showing manufacturing operations of a semiconductor device including a semiconductor device component according to an embodiment of the present disclosure.

FIG. 27 is a flowchart showing a manufacturing method 2700 of a semiconductor device including a semiconductor device component according to an embodiment of the present disclosure. It is understood that additional operations can be provided before, during, and after processes discussed in FIG. 27, and some of the operations described below can be replaced or eliminated, for additional embodiments of the method. The order of the operations/processes may be interchangeable and at least some of the operations/processes may be performed in a different sequence. In some embodiments, at least two or more operations/processes are performed overlapping in time, or almost simultaneously.

Referring to FIG. 27 and FIG. 26, the method 2700 of manufacturing a semiconductor device 2600 includes an operation S2710 of forming a semiconductor device component 20 over a first main surface 11 of a semiconductor substrate 10 in a first direction (e.g., in the Z direction). In some embodiments, the semiconductor device component includes an epitaxial layer. In some embodiments, the epitaxial layer includes a source/drain region 22.

In operation S2720, a stack 30 of a plurality of alternating first layers 30A having a first refractive index $n_1$ and second layers 30B having a second refractive index $n_2$ are formed over the opposing second main surface (e.g., the surface of the backside 12) of the semiconductor substrate 10 in an opposing second direction (e.g., in the opposing Z direction). The first refractive index and the second refractive index are different. The stack 30 of the plurality of alternating first layers and second layers forms a distributed Bragg reflector. In operation S2730, an opening 40 is formed in the stack 30 of the plurality of first layers 30A and second layers 30B passing through the second main surface 12 of the semiconductor substrate 10 to expose a portion of the epitaxial layer 22. In operation S2740, a dopant is implanted into the epitaxial layer 22 to form a doped epitaxial layer through the opening 40. In operation S2750, the doped epitaxial layer 22 is irradiated with laser radiation through the opening 40 to anneal the epitaxial layer 22. In some embodiments, the epitaxial layer 22 includes a source/drain region 22.

Figure 28:
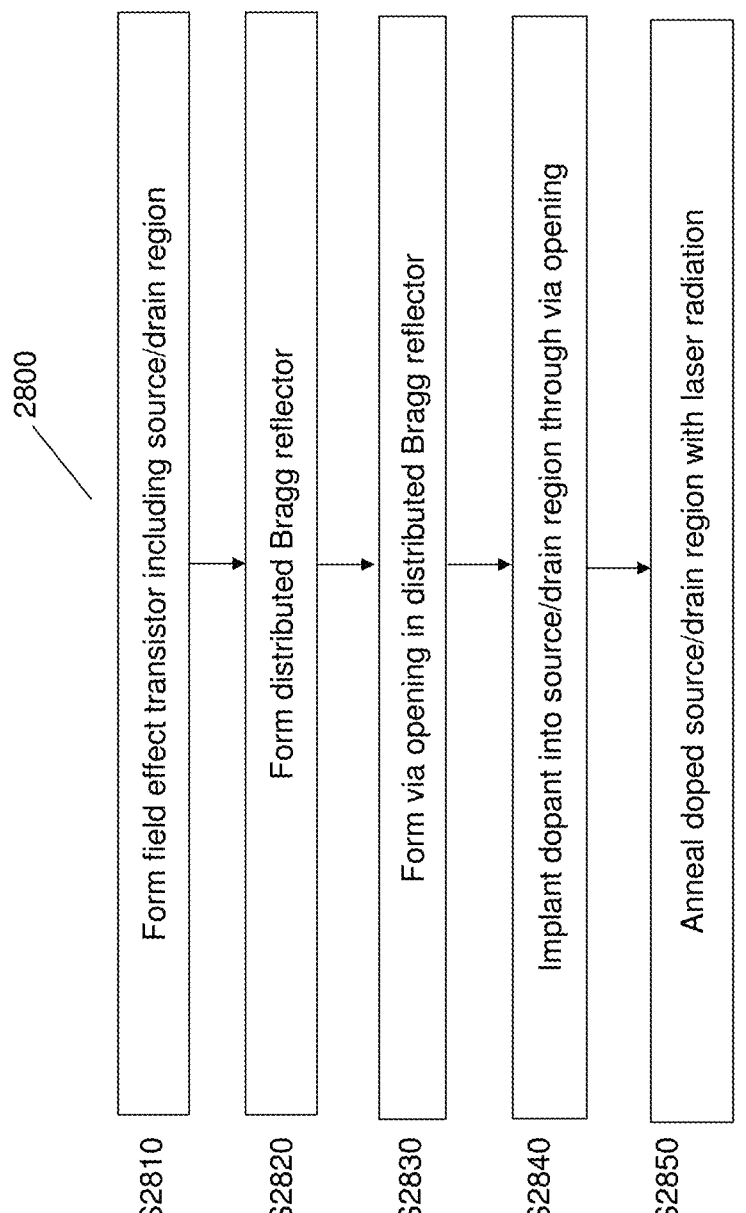
FIG. 28 is a flowchart showing manufacturing operations of a semiconductor device including a field effect transistor according to another embodiment of the present disclosure.

FIG. 28 is a flowchart showing a manufacturing method 2800 of a semiconductor device including a field effect transistor according to another embodiment of the present disclosure. It is understood that additional operations can be provided before, during, and after processes discussed in FIG. 28, and some of the operations described below can be replaced or eliminated, for additional embodiments of the method. The order of the operations/processes may be interchangeable and at least some of the operations/processes may be performed in a different sequence. In some embodiments, at least two or more operations/processes are performed overlapping in time, or almost simultaneously.

Referring to FIG. 28 and FIG. 26, the manufacturing method 2800 of a semiconductor device 2600 includes an operation S2810 of forming a field effect transistor 20 over a first main surface 11 of a wafer 10. In some embodiments, the field effect transistor 20 includes a gate structure 21 and a source/drain region 22. In some embodiments, the field effect transistor 20 is a FinFET. In other embodiments, the transistor 20 is a planar transistor or a GAA FET. In operation S2820, a distributed Bragg reflector 30 is formed over an opposing second main surface 12 (e.g., the surface of the backside) of the wafer 10. In operation S2830, a via opening 40 is formed in the distributed Bragg reflector 30 exposing a portion of the source/drain region 22. In operation S2840, a dopant is implanted into the source/drain region 22 to form a doped source/drain region 22. In operation S2850, the doped source/drain region 22 is laser annealed using laser radiation.

The methods and devices of the present disclosure provide improved backside dopant activation by high temperature laser annealing without damage to low thermal budget BEOL components, such as backend low-k film and Cu interconnects. The distributed Bragg reflector 30 in embodiments of the disclosure substantially reflects all the laser radiation impinging on the distributed Bragg reflector, thereby protecting structures or regions such as metal interconnects and low-k dielectric films in the BEOL structure, and high-k dielectrics and metal gates in the MEOL structure from being overheated and damaged by the annealing laser radiation.

It will be understood that not all advantages have been necessarily discussed herein, no particular advantage is required for all embodiments or examples, and other embodiments or examples may offer different advantages.

In accordance with an aspect of the present disclosure, a method of manufacturing a semiconductor device includes forming a semiconductor device component over a first main surface of a semiconductor substrate, forming a plurality of alternating first layers having a first refractive index and second layers having a second refractive index over an opposing second main surface of the semiconductor substrate, forming an opening in the plurality of first layers and second layers and through the second main surface of the semiconductor substrate exposing a portion of the epitaxial layer through the opening, implanting a dopant into the epitaxial layer to form a doped epitaxial layer via the opening, and irradiating the doped epitaxial layer with laser radiation through the opening. The semiconductor device component includes an epitaxial layer. The first refractive index and the second refractive index are different. In one or more of the foregoing and/or following embodiments, a first thickness ($d_1$) of the first layer is a function of a wavelength ($\lambda$) of the laser radiation and a first refractive index ($n_1$) of the first layer, $$d_1 = \frac{\lambda}{4n_1},$$

a second thickness ($d_2$) of the second layer is a function of the wavelength ($\lambda$) of the laser radiation and a second refractive index ($n_2$) of the second layer, $$d_2 = \frac{\lambda}{4n_2},$$

and the wavelength ($\lambda$) of the laser radiation is in a range of 512-552 nm. In one or more of the foregoing and/or following embodiments, the first layers include amorphous silicon, and the second layers include silicon oxide or silicon nitride. In one or more of the foregoing and/or following embodiments, the epitaxial layer includes SiGeB, and implanting the dopant into the epitaxial layer includes implanting Ge and B to amorphize the epitaxial layer and to increase B concentration in the doped epitaxial layer. In one or more of the foregoing and/or following embodiments, the laser radiation radiates the doped epitaxial layer through the opening in a time range of 1 nano-second to 100 milliseconds. In one or more of the foregoing and/or following embodiments, the laser radiation radiates through the opening to heat the doped epitaxial layer to a temperature in a range of 600-1200 C. In one or more of the foregoing and/or following embodiments, the method further includes depositing a conformal silicon nitride liner in the opening by atomic layer deposition, and dry etching the silicon nitride liner from a bottom of the opening so that the silicon nitride liner remains on sides of the opening. In one or more of the foregoing and/or following embodiments, the method further includes pre-silicide implanting a pre-silicide dopant into the epitaxial layer, depositing a metal on the epitaxial layer, and forming a metal silicide on the epitaxial layer. In one or more of the foregoing and/or following embodiments, the method further includes filling the opening with a metal material, and the metal material is selected from W, Co or Ru. In one or more of the foregoing and/or following embodiments, the method further includes after filling the opening with the metal material, planarizing an outside surface of the plurality of the alternating first and second layers by a chemical mechanical polishing.

In accordance with an aspect of the present disclosure, a method of manufacturing a semiconductor device includes: forming a field effect transistor over a first main surface of a wafer, forming a distributed Bragg reflector over an opposing second main surface of the wafer, forming a via opening in the distributed Bragg reflector exposing a portion of the source/drain region, implanting a dopant into the source/drain region to form a doped source/drain region, and laser annealing the doped source/drain region using laser radiation. The field effect transistor includes a source/drain region.

In one or more of the foregoing and/or following embodiments, the distributed Bragg reflector includes a plurality of alternating first layers having a first refractive index ($n_1$) and second layers having a second refractive index ($n_2$), and the first refractive index and the second refractive index are different. In one or more of the foregoing and/or following embodiments, a first thickness ($d_1$) of the first layer is a function of a wavelength ($\lambda$) of the laser radiation and the first refractive index ($n_1$) of the first layer, $$d_1 = \frac{\lambda}{4n_1},$$

and a second thickness ($d_2$) of the second layer is a function of the wavelength ($\lambda$) of the laser radiation and the second refractive index ($n_2$) of the second layer, $$d_2 = \frac{\lambda}{4n_2}.$$

In one or more of the foregoing and/or following embodiments, the method further includes after laser annealing the doped source/drain region, pre-silicide implanting a pre-silicide dopant into the source/drain region, depositing a metal on the epitaxial layer, and forming a metal silicide on the source/drain region.

In accordance with an aspect of the present disclosure, a semiconductor device includes: a field effect transistor disposed over a first main surface of a semiconductor substrate, a distributed Bragg reflector disposed over an opposing second main surface of the semiconductor substrate, and a conductive via disposed in the distributed Bragg reflector. The field effect transistor includes a gate structure and a source/drain region. The conductive via passes through the semiconductor substrate and is in direct electrical contact with the source/drain region. In one or more of the foregoing and/or following embodiments, the distributed Bragg reflector includes a plurality of alternating first layers having a first refractive index ($n_1$) and second layers having a second refractive index ($n_2$), and the first refractive index and the second refractive index are different. In one or more of the foregoing and/or following embodiments, a first thickness ($d_1$) of the first layer is a function of a wavelength ($\lambda$) of the laser radiation and the first refractive index ($n_1$) of the first layer, $$d_1 = \frac{\lambda}{4n_1},$$

and a second thickness ($d_2$) of the second layer is a function of the wavelength ($\lambda$) of the laser radiation and the second refractive index ($n_2$) of the second layer, $$d_2 = \frac{\lambda}{4n_2}.$$

In one or more of the foregoing and/or following embodiments, the first layers include amorphous silicon, and the second layers include silicon oxide or silicon nitride. In one or more of the foregoing and/or following embodiments, the source/drain region includes SiGeB. In one or more of the foregoing and/or following embodiments, the field effect transistor includes a metal oxide semiconductor field effect transistor, a fin field effect transistor, or a gate-all-around field effect transistor. In one or more of the foregoing and/or following embodiments, the semiconductor device further includes a Front End Of Line (FEOL) structure over the semiconductor substrate. The FEOL structure includes the gate structure and the source/drain region. In one or more of the foregoing and/or following embodiments, the semiconductor device further includes a Middle End Of Line (MEOL) structure over the FEOL structure. The MEOL structure includes gate to metal interconnects, source to metal interconnects, and drain to metal interconnects. In one or more of the foregoing and/or following embodiments, the semiconductor device further includes a Back End Of Line (BEOL) structure over the MEOL structure. The BEOL includes layers of metal interconnects and low-k dielectric films.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A method of manufacturing a semiconductor device, comprising:

forming a semiconductor device component over a first main surface of a semiconductor substrate, wherein the semiconductor device component includes an epitaxial layer;

forming a plurality of alternating first layers having a first refractive index and second layers having a second refractive index over an opposing second main surface of the semiconductor substrate, wherein the first refractive index and the second refractive index are different;

forming an opening in the plurality of first layers and second layers, and through the second main surface of the semiconductor substrate exposing a portion of the epitaxial layer through the opening;

implanting a dopant into the epitaxial layer to form a doped epitaxial layer via the opening; and irradiating the doped epitaxial layer with laser radiation through the opening.

2. The method of claim 1, wherein:

a first thickness ($d_1$) of the first layers satisfies $$d_1 = \frac{\lambda}{4n_1},$$

where $\lambda$ is a wavelength of the laser radiation and $n_1$ is the first refractive index of the first layers, a second thickness ($d_2$) of the second layers satisfies $$d_2 = \frac{\lambda}{4n_2},$$

where $n_2$ is the second refractive index of the second layers, and the wavelength ($\lambda$) of the laser radiation is in a range of 512 to 552 nm.

3. The method of claim 1, wherein the first layers comprise amorphous silicon, wherein the second layers comprise silicon oxide or silicon nitride.

4. The method of claim 1, wherein the epitaxial layer comprises SiGeB, and wherein implanting the dopant into the epitaxial layer comprises implanting Ge and B to amorphize the epitaxial layer and to increase B concentration in the doped epitaxial layer.

5. The method of claim 1, wherein the laser radiation radiates the doped epitaxial layer through the opening in a time range of 1 nano-second to 100 milli-seconds.

6. The method of claim 4, wherein the laser radiation radiates through the opening to heat the doped epitaxial layer to a temperature in a range of 600° C. to 1200° C.

7. The method of claim 1, further comprising:

depositing a conformal silicon nitride liner in the opening by atomic layer deposition; and dry etching the silicon nitride liner from a bottom of the opening so that the silicon nitride liner remains on sides of the opening.

8. The method of claim 1, further comprising:

pre-silicide implanting a pre-silicide dopant into the epitaxial layer;

depositing a metal on the epitaxial layer; and forming a metal silicide on the epitaxial layer.

9. The method of claim 1, further comprising:

filling the opening with a metal material, wherein the metal material is selected from a group consisting of W, Co, and Ru.

10. The method of claim 9, further comprising:

after filling the opening with the metal material, planarizing an outside surface of the plurality of the alternating first and second layers by a chemical mechanical polishing.

11. A method of manufacturing a semiconductor device, comprising:

forming a field effect transistor over a first main surface of a wafer, wherein the field effect transistor includes a source/drain region;

forming a distributed Bragg reflector over an opposing second main surface of the wafer;

forming a via opening in the distributed Bragg reflector exposing a portion of the source/drain region;

implanting a dopant into the source/drain region to form a doped source/drain region; and laser annealing the doped source/drain region using laser radiation.

12. The method of claim 11, wherein the distributed Bragg reflector comprises a plurality of alternating first layers having a first refractive index ($n_1$) and second layers having a second refractive index ($n_2$), wherein the first refractive index and the second refractive index are different.

13. The method of claim 12, wherein:

a first thickness ($d_1$) of the first layers satisfies $$d_1 = \frac{\lambda}{4n_1},$$

where $\lambda$ is a wavelength of the laser radiation and $n_1$ is the first refractive index of the first layers, and a second thickness ($d_2$) of the second layers satisfies $$d_2 = \frac{\lambda}{4n_2},$$

where $n_2$ is the second retractive index of the second layers.

14. The method of claim 11, further comprising:

after laser annealing the doped source/drain region, pre-silicide implanting a pre-silicide dopant into the source/drain region;

depositing a metal on the epitaxial layer; and forming a metal silicide on the source/drain region.

15. A method of manufacturing a semiconductor device, comprising:

forming a gate all around (GAA) field effect transistor (FET) over a first main surface of a semiconductor substrate, wherein the GAA FET includes an epitaxial layer;

forming a plurality of alternating amorphous silicon layers and silicon oxide layers over an opposing second main surface of the semiconductor substrate;

forming an opening in the plurality of alternating amorphous silicon layers and silicon oxide layers, and through the second main surface of the semiconductor substrate exposing a portion of the epitaxial layer through the opening;

implanting a dopant into the epitaxial layer to form a doped epitaxial layer via the opening;

irradiating the doped epitaxial layer with laser radiation through the opening; and forming a metal silicide on the epitaxial layer.

16. The method of claim 15, wherein:

a first thickness ($d_1$) of the amorphous silicon layers satisfies $$d_1 = \frac{\lambda}{4n_1},$$

where $\lambda$ is a wavelength of the laser radiation and n1 is a first refractive index of the amorphous silicon layers, a second thickness ($d_2$) of the silicon oxide layers satisfies $$d_2 = \frac{\lambda}{4n_2},$$

where $n_2$ is a second refractive index of the silicon oxide layers, and the wavelength ($\lambda$) of the laser radiation is in a range of 512 to 552 nm.

17. The method of claim 15, further comprising:

depositing a conformal silicon nitride liner in the opening by atomic layer deposition; and dry etching the silicon nitride liner from a bottom of the opening so that the silicon nitride liner remains on sides of the opening.

18. The method of claim 15, wherein:

the epitaxial layer comprises SiGeB, and implanting the dopant into the epitaxial layer comprises implanting Ge and B to amorphize the epitaxial layer and to increase B concentration in the doped epitaxial layer.

19. The method of claim 15, wherein the laser radiation radiates the doped epitaxial layer through the opening in a time range of 1 nano-second to 100 milli-seconds.

20. The method of claim 19, wherein the laser radiation radiates through the opening to heat the doped epitaxial layer to a temperature in a range of 600° C. to 1200° C.

* * * * *